United States Patent
Jun et al.

(10) Patent No.: US 10,824,011 B2
(45) Date of Patent: Nov. 3, 2020

(54) PHOTOLUMINESCENT POLARIZERS HAVING METAL FILM WITH SURFACE PLASMON COUPLING AND ELECTRONIC DEVICES INCLUDING THE SAME

(71) Applicants: SAMSUNG ELECTRONICS CO., LTD., Suwon-si, Gyeonggi-do (KR); Bilkent University, Ankara (TR)

(72) Inventors: Shin Ae Jun, Seongnam-si (KR); Hilmi Volkan Demir, Ankara (TR); Eun Joo Jang, Suwon-si (KR); Burak Guzelturk, Ankara (TR); Kiyanc Gungor, Ankara (TR); Onur Erdem, Ankara (TR)

(73) Assignees: SAMSUNG ELECTRONICS CO., LTD., Gyeonggi-Do (KR); BILKENT UNIVERSITY, Ankara (TR)

( * ) Notice: Subject to any disclaimer, the term of this patent is extended or adjusted under 35 U.S.C. 154(b) by 379 days.

(21) Appl. No.: 15/862,182

(22) Filed: Jan. 4, 2018

(65) Prior Publication Data
US 2018/0188609 A1    Jul. 5, 2018

(30) Foreign Application Priority Data
Jan. 4, 2017   (KR) .................. 10-2017-0001578

(51) Int. Cl.
*G02F 1/1335* (2006.01)
*G02F 1/1337* (2006.01)
(Continued)

(52) U.S. Cl.
CPC .... *G02F 1/133617* (2013.01); *G02F 1/13362* (2013.01); *G02F 1/133528* (2013.01);
(Continued)

(58) Field of Classification Search
CPC ........ B82Y 20/00; G02B 1/002; G02B 1/005; G02B 5/008; G02B 6/1226;
(Continued)

(56) References Cited

U.S. PATENT DOCUMENTS

| 7,288,783 | B2 | 10/2007 | Akiyama | |
| 2002/0036828 | A1* | 3/2002 | Wong | G02B 27/288 |
| | | | | 359/585 |

(Continued)

FOREIGN PATENT DOCUMENTS

| JP | 2003204121 A | 7/2003 |
| JP | 2012114419 A | 6/2012 |

(Continued)

OTHER PUBLICATIONS

Amit Sitt, et al., "Highly Emissive Nano Rod-in-Rod Heterostructures with Strong Linear Polarization", Nano Lett., 2011, 11, 2054-2060.
(Continued)

*Primary Examiner* — Ryan S Dunning
(74) *Attorney, Agent, or Firm* — Cantor Colburn LLP

(57) ABSTRACT

A photoluminescent polarizer including: a base having a first surface, a second surface opposite to the first surface, and a plurality of grid elements disposed on the first surface; wherein a grid element includes a first lateral face, a second lateral face, and at least one photoluminescent unit stack disposed on at least one of the first lateral face and the second lateral face, wherein the first lateral face is angled away from a line perpendicular to the first surface of the base and the second lateral face angled toward the first lateral face and away from the line, wherein the photoluminescent unit stack is disposed on at least one of the first lateral face and/or to the second lateral face, wherein the photoluminescent unit stack comprises a light emitting film and a metal film, the metal film disposed on a surface of the light emitting film.

30 Claims, 23 Drawing Sheets

(51) Int. Cl.
*G02F 1/13357* (2006.01)
*H01L 51/52* (2006.01)
*H01L 51/50* (2006.01)
*H01L 33/58* (2010.01)
*G02B 6/122* (2006.01)
*G02B 5/00* (2006.01)

(52) U.S. Cl.
CPC .. *G02F 1/133536* (2013.01); *G02F 1/133711* (2013.01); *H01L 51/50* (2013.01); *H01L 51/5281* (2013.01); *G02B 5/008* (2013.01); *G02B 6/1226* (2013.01); *G02F 2001/133548* (2013.01); *G02F 2001/133614* (2013.01); *G02F 2202/36* (2013.01); *H01L 33/58* (2013.01)

(58) Field of Classification Search
CPC .... G02B 5/30–3075; G02B 27/28–288; G02F 1/133528; G02F 1/133533; G02F 1/133536; G02F 2001/133531; G02F 2001/133538; G02F 2001/133541; G02F 2001/133543; G02F 2001/133545; G02F 2001/133548; G02F 2001/13355; G02F 1/13362; G02F 2202/30; G02F 2202/32; G02F 2202/36; G02F 2203/10; H01L 21/02601; H01L 29/0669; H01L 33/58; H01L 51/50; H01L 51/5281
See application file for complete search history.

(56) References Cited

U.S. PATENT DOCUMENTS

| | | | |
|---|---|---|---|
| 2009/0159869 A1 | 6/2009 | Ponce et al. | |
| 2013/0240829 A1 | 9/2013 | Kuramachi | |
| 2015/0109561 A1* | 4/2015 | Fuchida | G02B 1/105 349/96 |
| 2016/0027963 A1 | 1/2016 | Jun et al. | |

FOREIGN PATENT DOCUMENTS

| | | |
|---|---|---|
| KR | 1020060027133 A | 3/2006 |
| KR | 1020160012843 A | 2/2016 |

OTHER PUBLICATIONS

Benjamin Abecassis, et al., "Self-Assembly of CdSe Nanoplatelets into Giant Micrometer-Scale Needles Emitting Polarized Light", Nano Lett., 2014, 14, 710-715.

Can Uran, et al., "Highly polarized light emission by isotropic quantum dots integrated with magnetically aligned segmented nanowires", Appl. Phys. Lett., 105, 141116 (2014).

Elsa Cassette, et al., "Colloidal CdSe/CdS Dot-in-Plate Nanocrystals with 2D-Polarized Emission", ACS NANO, vol. 6, No. 8, 6741-6750, 2012.

Jiangtao Hu, et al., "Linearly Polarized Emission from Colloidal Semiconductor Quantum Rods", Science, vol. 292, pp. 2060-2063, Jun. 15, 2001.

Nitzan Livneh, et al., "Highly Directional Emission and Photon Beaming from Nanocrystal Quantum Dots Embedded in Metallic Nanoslit Arrays", Nano Lett. 2011, 11, 1630-1635.

Prasanta Mandal, et al., "Surface enhanced fluorescence and imaging with plasmon near-fields in gold corrugated gratings", Journal of Nanophotonics, vol. 6, 2012.

Somobrata Acharya, et al., "Nanorod-Driven Orientational Control of Liquid Crystal for Polarization-Tailored Electro-Optic Devices", Adv. Mater., 2009, 21, 989-993.

Svetlana G. Lukishova, et al., "Resonance in quantum dot fluorescence in a photonic bandgap liquid crystal host", Apr. 2012, vol. 37, No. 7, Optics Letters. pp. 1259-1261.

Tuncay Ozel, et al., "Anisotropic Emission from Multilayered Plasmon Resonator Nanocromposites of Isotropic Semiconductor Quantum Dots", ACS Nano, vol. 5, No. 2, 1328-1334, 2011.

Yating Wan, et al., "InAs/GaAs quantum dots on GaAs-on-V-grooved-Si Substrate with high optical quality in the 1.3 um band", Applied Physics Letters, 107, 081106 (2015).

* cited by examiner

FIG. 6A
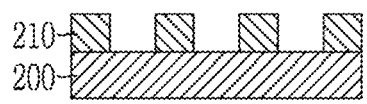
Step 1: Electron beam lithography of bilayer PMMA resist
FIG. 6B ⇩
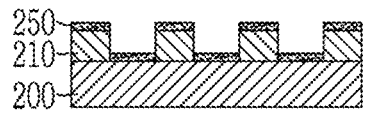
Step 2: Electron beam deposition of chromium mask layer
FIG. 6C ⇩
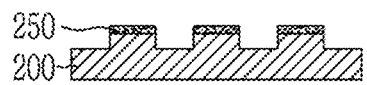
Step 3: Liftoff of PMMA and shallow DRIE of silicon
FIG. 6D ⇩
Step 4: Anisotropic KOH etch of silicon mold
FIG. 6E ⇩
Step 5: After antiadhesion layer coating PDMS replica is drop casted
FIG. 6F ⇩
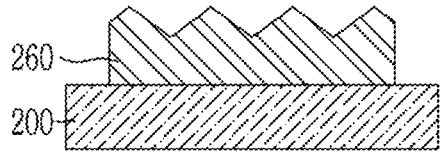
Step 6: Finalized PDMS replica bonded to glass

PHOTOLUMINESCENT POLARIZERS HAVING METAL FILM WITH SURFACE PLASMON COUPLING AND ELECTRONIC DEVICES INCLUDING THE SAME

CROSS-REFERENCE TO RELATED APPLICATION

This application claims priority to Korean Patent Application No. 10-2017-0001578 filed on Jan. 4, 2017, and all the benefits accruing therefrom under 35 U.S.C. § 119, the content of which is incorporated herein in its entirety by reference.

BACKGROUND

1. Field

Embodiments of a photoluminescent polarizer and an electronic device including the same are disclosed.

2. Description of the Related Art

A panel display such as a Liquid Crystal Display ("LCD") device is a non-emissive type of display that may utilize an external light source to display information. A backlight unit disposed at the back of the display panel may emit non-polarized light, which passes through a polarizer, is thereby converted to polarized light, and then passes through a panel including a liquid crystal layer, a color filter, and/or another polarizer, and finally provides image information to a final user. The light provided by the backlight unit including a light emitting diode passes through a plurality of optical layers disposed within the liquid crystal display and has a final light intensity that is decreased to only about 2% to about 8% of its original intensity. Therefore, the optical efficiency of the device becomes low.

Therefore, it is desirable to develop a technology for reducing the light loss from the light source, such as a backlight unit, and to enhance optical efficiency of a panel display device such as an LCD.

SUMMARY

An embodiment provides a photoluminescent polarizer that may enhance an optical efficiency of a panel display.

Another embodiment provides an electronic device including the photoluminescent polarizer.

In an embodiment of the invention, a photoluminescent polarizer includes a light-transmissive or transparent base having a first surface and a second surface opposite to the first surface, and a plurality of grid elements disposed on the first surface of the base wherein a grid element of the plurality of grid elements comprises a first lateral face, a second lateral face, and at least one photoluminescent unit stack disposed on at least one of the first lateral face and the second lateral face, wherein the first lateral face is angled away from a line perpendicular to the first surface of the base and the second lateral face is angled toward the first lateral face and away from the line perpendicular to the first surface of the base;

wherein the photoluminescent unit stack comprises a light emitting film comprising a light emitting material and a metal film comprising a metal configured for surface plasmon coupling with the light emitting material, the metal film being disposed on at least one surface of the light emitting film; and wherein the photoluminescent polarizer is configured to linearly polarize at least a portion of incident light passing through the second surface of the base, a portion of light emitted from the light emitting material, or a combination thereof, and to emit polarized light from a front surface of the polarizer.

The light-transmissive or transparent base may have a light transmittance of greater than or equal to about 60%;

The light transmissive or transparent base may be flexible. The base may include a material having a flexural modulus of at least about 10 millipascals flexible or greater.

The first surface and the second surface of the base may be substantially parallel to each other.

The plurality of the grid elements may be disposed parallel to each another in a longitudinal direction.

The plurality of the grid elements may be spaced evenly apart from one another.

The plurality of the grid elements may be disposed at a predetermined pitch and have a corrugated pattern.

The predetermined pitch may be less than or equal to about 900 nanometers (nm).

The grid element may be integrated with the base.

An angle between the first lateral face and the line perpendicular to the first surface of the base is greater than or equal to about 1 degree and less than about 90 degrees.

An angle between the second lateral face and the line perpendicular to the first surface of the base is greater than or equal to about 1 degree and less than about 90 degrees.

An angle between the first lateral face and the line perpendicular to the first surface of the base and/or between the second lateral face and the line perpendicular to the first surface of the base, may be greater than or equal to about 1 degree, for example, greater than or equal to about 2 degrees, greater than or equal to about 3 degrees, greater than or equal to about 4 degrees, greater than or equal to about 5 degrees, greater than or equal to about 6 degrees, greater than or equal to about 7 degrees, greater than or equal to about 8 degrees, greater than or equal to about 9 degrees, greater than or equal to about 10 degrees, greater than or equal to about 11 degree, for example, greater than or equal to about 12 degrees, greater than or equal to about 13 degrees, greater than or equal to about 14 degrees, greater than or equal to about 15 degrees, greater than or equal to about 16 degrees, greater than or equal to about 17 degrees, greater than or equal to about 18 degrees, greater than or equal to about 19 degrees, greater than or equal to about 20 degrees, greater than or equal to about 21 degree, for example, greater than or equal to about 22 degrees, greater than or equal to about 23 degrees, greater than or equal to about 24 degrees, greater than or equal to about 25 degrees, greater than or equal to about 26 degrees, greater than or equal to about 27 degrees, greater than or equal to about 28 degrees, greater than or equal to about 29 degrees, greater than or equal to about 30 degrees, greater than or equal to about 31 degree, greater than or equal to about 32 degrees, greater than or equal to about 33 degrees, greater than or equal to about 34 degrees, greater than or equal to about 35 degrees, greater than or equal to about 36 degrees, greater than or equal to about 37 degrees, greater than or equal to about 38 degrees, greater than or equal to about 39 degrees, greater than or equal to about 40 degrees, greater than or equal to about 41 degrees, greater than or equal to about 42 degrees, greater than or equal to about 43 degrees, greater than or equal to about 44 degrees, or greater than or equal to about 45 degrees.

An angle between the first lateral face and the normal and/or an angle between the second lateral face and the normal may be less than 90 degrees, for example, less than or equal to about 80 degrees, less than or equal to about 75 degrees, less than or equal to about 70 degrees, less than or equal to about 65 degrees, less than or equal to about 60 degrees, less than or equal to about 55 degrees, less than or equal to about 50 degrees, less than or equal to about 45 degrees, or less than or equal to about 40 degrees.

A height of the grid element may be greater than or equal to about 50 nm and less than or equal to about 200 nm.

A width of the grid element may be greater than or equal to about 50 nm and less than or equal to about 200 nm.

The grid element of the plurality of grid elements may have a triangular prism shape, and one of three rectangular lateral faces of the triangular prism is on the surface of the base and two opposite triangular end faces are disposed perpendicular to the surface of the base.

The light emitting film may have a thickness of greater than or equal to about 1 nm and less than or equal to about 50 nm.

The metal film may have a thickness of greater than or equal to about 10 nm and less than or equal to about 150 nm, or less than or equal to about 100 nm, or less than or equal to about 50 nm.

The photoluminescent unit stack may further include a spacer separating the light emitting film and the metal film and the spacer may include at least one layer including a polyelectrolyte that is transparent to light having a wavelength between 300 nm and 700 nm.

The polyelectrolyte may include a cation, an anion, or a combination thereof, wherein the cation comprises $NR_4^+$ wherein each R is independently hydrogen or a C1 to C3 alkyl), $Na^+$, $K^+$, $Ca^{2+}$, $Mg^{2+}$, or a combination thereof; and the anion is selected from a halide, COO—, $SO_4^{2-}$, $SO_3^-$, $HPO_3^-$, or a combination thereof.

The spacer may include at least two layers including a polyelectrolyte, and two adjacent layers including the polyelectrolyte may have opposite charges with respect to each other.

The polyelectrolyte may include poly(diallyldimethylsulfonium chloride), polystyrene sulfonate, or a combination thereof.

A thickness of the spacer may be greater than or equal to about 1 nm and less than or equal to about 50 nm, for example, less than or equal to about 40 nm, less than or equal to about 30 nm, or less than or equal to about 20 nm. The metal film may cover at least a portion of a surface of the light emitting film. A coverage ratio of the metal film with respect to a total area of the surface of the light emitting film is greater than or equal to about 75%. The metal film may be disposed on greater than or equal to about 75% of a total surface area of the at least one surface of the light emitting film.

The light emitting material may absorb light having a wavelength between about 300 nanometers to about 690 nanometers, and may emit light having a wavelength between about 450 nanometers to about 660 nanometers.

The light emitting material may include a semiconductor nanocrystal, a nanosized inorganic phosphor, an organic dye, or a combination thereof.

The semiconductor nanocrystal may have a particle dimension of 2 nm to 12 nm, and the semiconductor nanocrystal may absorb light having a wavelength between about 300 nanometers to about 690 nanometers and may emit light having a wavelength between about 450 nanometers to about 700 nanometers.

The semiconductor nanocrystal may include a Group II-VI compound, a Group III-V compound, a Group IV-VI compound, a Group IV element or compound, a Group compound, a Group II-IV-VI compound, or a combination thereof.

The semiconductor nanocrystal may include a quantum dot, a nanorod, a nanoplatelet, or a combination thereof.

The light emitting film may include a plurality of layers including the light emitting material.

At least one layer of the plurality of layers may include a monolayer of semiconductor crystals.

A spacer layer including a polyelectrolyte may be interposed between at least two adjacent layers among the plurality of layers.

The surfaces of the semiconductor nanocrystal and the polyelectrolyte may have opposite charges with each other.

The metal film may include at least one metal layer. The metal layer may include at least one of a continuous metal layer consisting of the metal, a discontinuous metal layer including a plurality of nanosize particles including the metal, or a combination thereof.

The metal film may include a plurality of metal layers and a spacer layer may be interposed between at least two adjacent metal layers among the plurality of metal layers.

A thickness of the continuous metal layer or the discontinuous metal layer may be greater than or equal to about 1 nanometers and less than or equal to about 75 nanometers. A thickness of the continuous metal layer or the discontinuous metal layer may be less than or equal to about 75 nm, for example, less than or to equal to about 70 nm, less than or equal to about 65 nm, less than or equal to about 60 nm, less than or equal to about 55 nm, less than or equal to about 50 nm, less than or equal to about 45 nm, less than or equal to about 40 nm, less than or equal to about 35 nm, less than or equal to about 30 nm, less than or equal to about 25 nm, less than or equal to about 20 nm or less than or equal to about 18 nm. A thickness of the continuous metal layer or the discontinuous metal layer may be greater than or equal to about 1 nm, for example, greater than or equal to about 3 nm, greater than or equal to about 5 nm, greater than or equal to about 7 nm, greater than or equal to about 9 nm, or greater than or equal to about 10 nm.

The metal may include gold, silver, copper, platinum, aluminum, or a combination thereof.

At least two photoluminescent unit stacks may be disposed on the at least one of the first lateral face and the second lateral face.

The front surface of the photoluminescent polarizer may include a corrugated pattern.

In other embodiments, an electronic device includes the foregoing photoluminescent polarizer; and a light source, wherein the light source is disposed to provide incident light to the second surface of the base of the photoluminescent polarizer.

The electronic device may be a light emitting diode ("LED"), an organic light emitting diode ("OLED"), a sensor, a photovoltaic device, or a liquid crystal display device ("LCD").

Embodiments of the photoluminescent polarizer may include a high quality sharp edge V-grooves and a nanocrystal composite disposed on a surface thereof and may emit polarized light from a front surface thereof. Accordingly, the photoluminescent polarizer of the embodiments may be utilized in a panel display device which utilizes an external light source. The photoluminescent polarizer of the embodiments may achieve a high degree of polarization that is greater than or equal to about 0.78 due to an increased light efficiency.

BRIEF DESCRIPTION OF THE DRAWINGS

These and/or other features will become apparent and more readily appreciated from the following description of embodiments, taken in conjunction with the accompanying drawings, in which:

FIGS. 6A to 6F are views schematically illustrating a production process for preparing a structure including a base and a plurality of grid elements for a photoluminescent polarizer, according to a non-limiting embodiment;

DETAILED DESCRIPTION

Figure 1:
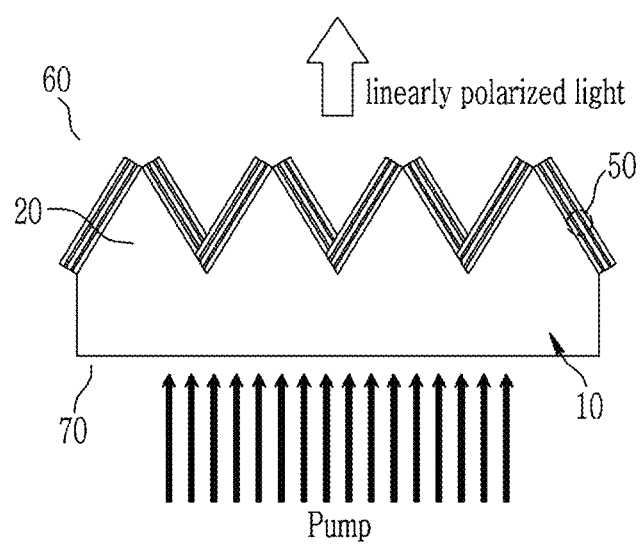
FIG. 1 is a view schematically showing a cross-section of a photoluminescent polarizer, according to a non-limiting embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, 5%, or 1% of the stated value.

As used herein, unless otherwise provided, the term "substituted" means the case where a compound or a group or a moiety is substituted with at least one (e.g., 1, 2, 3, or 4) substituent independently selected from a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C30 cycloalkenyl group, a C3 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxylic acid group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or -PO$_3$M$_2$, wherein M is an organic or inorganic cation), and a combination thereof, for example, instead of hydrogen.

As used herein, the term "linearly polarized" or "linear polarization" means that the electric field component of an electromagnetic wave (e.g., light) is constrained to oscillate in a single plane which is orthogonal to the propagation direction thereof.

As used herein, the wording "transparent to light of a predetermined wavelength" refers to a case where the transmittance of the light having the given (predetermined) wavelength is greater than or equal to about 60%, for example, greater than or equal to about 70%, greater than or equal to about 80%, or greater than or equal to about 90%.

The amount of polarized light emitted by an emitter can be expressed in terms of either the degree of polarization or anisotropy. If the intensity of the parallel and perpendicular components in the light beam from the emitter are $I_{TM}$ and $I_{TE}$, respectively, then the anisotropy of the light is defined as $$r = \frac{I_{TM} - I_{TE}}{I_{TM} + 2I_{TE}} \quad (1)$$

whereas the degree of polarization P is $$P = \frac{I_{TM} - I_{TE}}{I_{TM} + I_{TE}} \quad (2)$$

As a result, the emission anisotropy and the degree of polarization are related by the following formula, $$P = \frac{3r}{2+r} \quad (3)$$

or its corollary, $$r = \frac{2P}{3-P} \quad (4)$$

In an embodiment, a photoluminescent polarizer includes a light transmissive or transparent base having a first surface (hereinafter, also referred to as a front surface), a second surface opposite to the first surface, and a plurality of grid elements disposed on the first surface of the base. A grid element of the plurality of grid elements includes a first lateral face, a second lateral face, and at least one photoluminescent unit stack disposed on at least one of the first lateral face and the second lateral face. The first lateral face is angled away from normal with respect to the first surface of the base and the second lateral face is angled toward the first lateral face and away from the normal. As used herein, the term "normal" refers to a line perpendicular to the first surface of the base at the boundary between adjacent grid elements (see for example, FIG. 2). The photoluminescent unit stack includes a light emitting film including a light emitting material and a metal film including a metal configured for surface plasmon coupling with the light emitting material. The metal film is disposed on at least one side (surface) of the light emitting film. The photoluminescent polarizer is configured to linearly polarize at least a portion of incident light passing through the second surface of the base, at least a portion of light emitted from the light emitting material, or a combination thereof, and to emit polarized light from the front surface (or front plane or first surface) of the polarizer.

In recent years, there have been various efforts to generate polarized light in colloidal semiconductor quantum dots (QDs), which recently have also attracted great interest from the display industry due to their spectrally narrow emission, i.e., saturated colors. For example, the QD-based backlights in the LCDs may favorably enhance the color gamut as compared to the backlights that use phosphor based white LEDs. However, the LCDs based on the QD-backlights also suffer from producing randomly polarized light since isotropic QDs emit randomly polarized light. Therefore, the LCDs based on the QD-backlights may include the use of rear-polarizer, which limits the overall efficiency of the displays.

Metal nanoparticle—QD nanocomposites may be effectively plasmonic nanocavities, and may achieve polarized light emission from the QDs through near-field interactions generating an anisotropic enhancement of the radiative decay rates in the QDs. Such plasmon-QD composites may be fabricated using solution processing techniques potentially allowing for large-scale fabrication at low cost. However, there have been several challenges in these plasmon-QD composites including inefficient emission of polarized light at the front plane or the front surface, low polarization contrast, and high optical losses, which limit their use as polarized light generators.

In addition, such planar plasmon-QD composites possess a fundamental trade-off between the degree of polarization and optical losses, giving rise to practical and technical challenges. One major problem is the low polarization degree due the poor plasmonic coupling to curb and manage optical losses. Absorption of the emitted light and quenching of the QDs by near-field interactions may significantly reduce the overall efficiency. Moreover, the foregoing composites may achieve polarized light emission at the front plane only when they use an oblique angle excitation. In case of such plasmon-QD composites, the polarized light is emitted from the side of the composite, not from the front surface, which makes the use of the plasmon-QD composite for a panel display very difficult. Therefore, the plasmon quantum dot (plasmon-QD) composite cannot provide homogeneous luminescence with uniform polarizing quality.

According to an embodiment, the photoluminescent polarizer provides a model system of polarizing color enrichment beyond the state of the art. The photoluminescent polarizer of the embodiments may resolve the foregoing problems and achieves polarized emission at the front surface.

FIG. 1 is a view schematically showing an embodiment of a photoluminescent polarizer. Referring to FIG. 1, the photoluminescent polarizer of an embodiment includes: a light transmissive or transparent base 10 and a plurality of grid elements 20 disposed on a surface of the base. The grid element includes a first lateral face 30 and a second lateral face 40. At least one photoluminescent unit stack (s) 50 is disposed on at least one of the first and the second lateral faces. The first lateral face 30 of the grid element 20 is angled away from normal with respect to the surface of the base 10 and the second lateral face 40 is angled toward the first lateral face 30 and away from normal with respect to the surface of the base.

The photoluminescent unit stack 50 may include a light emitting film including a light emitting material (e.g., a semiconductor nanocrystal particle) and a metal film disposed on at least one side of the light emitting film. The metal film includes a metal configured for (e.g., capable of) surface plasmon coupling to form a plasmon nanocavity. By having the foregoing structure, the photoluminescent polarizer of the embodiment may linearly polarize at least a portion of incident light passing through the second surface, at least a portion of light emitted from the light emitting material, or a combination thereof, and at the same time, may emit polarized light from the front surface of the polarizer (for example, parallel to the first surface and/or the second surface of the base).

The base may include a transparent or a light transmissive material. The transparent or light transmissive material is not particularly limited and may be selected appropriately. In one embodiment, for example, the base may include a polymer such as a polyimide, an acrylic polymer, a polyethylene, a polypropylene, a polystyrene, polyvinylpyrrolidone ("PVP"), a silicone, a polycarbonate, or the like, an inorganic material such as glass and quartz, an indium tin oxide, a tin oxide, a zinc oxide or a titanium oxide, or a combination thereof, but is not limited thereto. A combination comprising at least one of the foregoing may also be used. The base may be a flexible substrate. In some embodiments, the base may include a glass, polycarbonate, a silicone polymer such as polydimethylsiloxane ("PDMS"), or a combination thereof.

The transparent or a transmissive base may have a transmittance of greater than or equal to about 60%, greater than or equal to about 70%, greater than or equal to about 80%, greater than or equal to about 85%, greater than or equal to about 90%, greater than or equal to about 95%, greater than or equal to about 96%, greater than or equal to about 97%, greater than or equal to about 98%, or greater than or equal to about 99%, with respect to incident light at the second surface 70 (e.g., light having a wavelength of greater than or equal to about 300 nm, for example greater than or equal to about 450 nm, or greater than or equal to about 460 nm, and less than or equal to about 690 nm for example, less than or equal to about 600 nm less than or equal to about 550 nm, less than or equal to about 500 nm, or less than or equal to about 490 nm).

Figure 2:
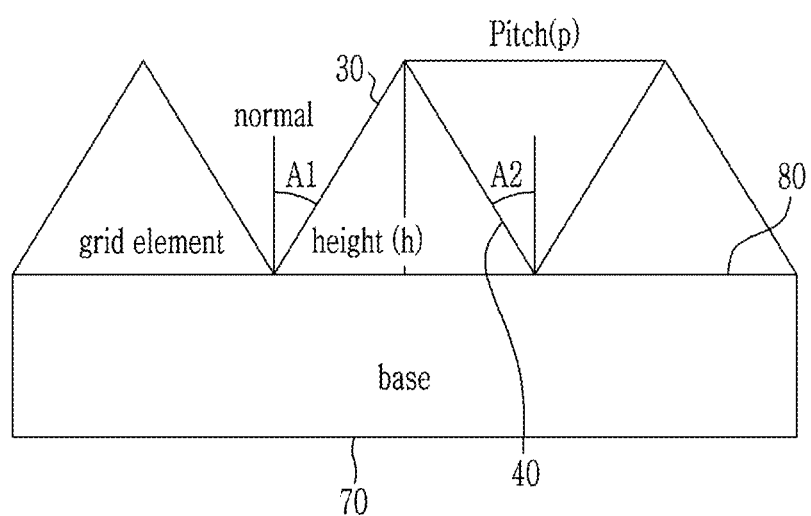
FIG. 2 is a view schematically illustrating a base and a grid element that are included in the photoluminescent polarizer, according to a non-limiting embodiment.

FIG. 2 is a view schematically illustrating a non-limiting example for the base 10 and the plurality of grid elements 20. Referring to FIG. 2, the plurality of the grid elements 20 are disposed at a predetermined space, for example, such that they are substantially parallel to one another in a longitudinal direction. In FIG. 2, the grid element 20 has a triangular cross-section, but it is not limited thereto. The grid element 20 may be integrated (e.g., unitary) with the base 10, and the base 10 and the grid element 20 may be made of the same material and may be inseparable from each other. The plurality of grid elements 20 may have substantially the same cross-section shape as each other. The plurality of grid elements 20 may be spaced with a predetermined pitch p. As used herein, the term "pitch" refers to a distance between the highest points of adjacent grid elements. The pitch of the plurality of grid elements 20 may be greater than or equal to about 50 nm, greater than or equal to about 60 nm, greater than or equal to about 70 nm, greater than or equal to about 80 nm, greater than or equal to about 90 nm, greater than or equal to about 100 nm, greater than or equal to about 110 nm, greater than or equal to about 120 nm, greater than or equal to about 130 nm, greater than or equal to about 140 nm, or greater than or equal to about 150 nm. The pitch may be less than or equal to about 900 nm, for example, less than or equal to about 800 nm, less than or equal to about 700 nm, less than or equal to about 600 nm, less than or equal to about 500 nm, less than or equal to about 400 nm, or less than or equal to about 300 nm.

The height h of the plurality of grid elements 20 may be greater than or equal to about 50 nm, greater than or equal to about 60 nm, greater than or equal to about 70 nm, greater than or equal to about 80 nm, or greater than or equal to about 90 nm. The height of the grid element 20 is a distance from the first surface 80 of the base to the highest point of the grid element. The height h of the grid element 20 may be determined depending upon the v-groove angle and the periodicity.

In some embodiments, the height of the grid element (the distance between the base and the highest point of the grid) may be several micrometers. For example, the height of the grid element may be less than or equal to about 10 micrometers (um), less than or equal to about 9 um, less than or equal to about 8 um, less than or equal to about 7 um, less than or equal to about 6 um, less than or equal to about 5 um, less than or equal to about 4 um, less than or equal to about 3 um, less than or equal to about 2 um, less than or equal to about 1 um, less than or equal to about 900 nm, less than or equal to about 800 nm, less than or equal to about 700 nm, less than or equal to about 600 nm, less than or equal to about 500 nm, less than or equal to about 400 nm, less than or equal to about 300 nm, less than or equal to about 250 nm, or less than or equal to about 200 nm.

The pitch p and the height h of the grid element 20 may be controlled in light of a desired degree of polarization. In some embodiments, the less the pitch the higher degree of polarization.

A degree of the angle (A1) between the first lateral surface and the normal and/or a degree of the angle (A2) between the second lateral surface and the normal may be greater than or equal to about 1 degree, for example, greater than or equal to about 2 degrees, greater than or equal to about 3 degrees, greater than or equal to about 4 degrees, greater than or equal to about 5 degrees, greater than or equal to about 6 degrees, greater than or equal to about 7 degrees, greater than or equal to about 8 degrees, greater than or equal to about 9 degrees, greater than or equal to about 10 degrees, greater than or equal to about 11 degree, for example, greater than or equal to about 12 degrees, greater than or equal to about 13 degrees, greater than or equal to about 14 degrees, greater than or equal to about 15 degrees, greater than or equal to about 16 degrees, greater than or equal to about 17 degrees, greater than or equal to about 18 degrees, greater than or equal to about 19 degrees, greater than or equal to about 20 degrees, greater than or equal to about 21 degree, for example, greater than or equal to about 22 degrees, greater than or equal to about 23 degrees, greater than or equal to about 24 degrees, greater than or equal to about 25 degrees, greater than or equal to about 26 degrees, greater than or equal to about 27 degrees, greater than or equal to about 28 degrees, greater than or equal to about 29 degrees, greater than or equal to about 30 degrees, greater than or equal to about 31 degrees, greater than or equal to about 32 degrees, greater than or equal to about 33 degrees, greater than or equal to about 34 degrees, greater than or equal to about 35 degrees, greater than or equal to about 36 degrees, greater than or equal to about 37 degrees, greater than or equal to about 38 degrees, greater than or equal to about 39 degrees, greater than or equal to about 40 degrees, greater than or equal to about 41 degrees, greater than or equal to about 42 degrees, greater than or equal to about 43 degrees, greater than or equal to about 44 degrees, greater than or equal to about 45 degrees, greater than or equal to about 46 degrees, greater than or equal to about 47 degrees, greater than or equal to about 48 degrees, greater than or equal to about 49 degrees, or greater than or equal to about 50 degrees.

The degree of the angle (A1) between the first lateral face and the normal and/or the degree of the angle (A2) between the second lateral surface and the normal may be less than 90 degrees, for example, less than or equal to about 80 degrees, less than or equal to about 75 degrees, less than or equal to about 70 degrees, less than or equal to about 65 degrees, less than or equal to about 60 degrees, less than or equal to about 55 degrees, less than or equal to about 50 degrees, less than or equal to about 45 degrees, less than or equal to about 44 degrees, less than or equal to about 43 degrees, less than or equal to about 42 degrees, less than or equal to about 41 degrees, or less than or equal to about 40 degrees.

The angle (A1) and the angle (A2) may be selected appropriately considering the fabrication process of the polarizer.

In some embodiments, the grid element 20 may have a triangular prism shape. One of three rectangular lateral (side) faces of the triangular prism may be on the first surface of the base and two opposite triangular faces may be disposed perpendicular to the first surface of the base. In some embodiments, the front surface (or the front plane) of the polarizer may include V-shaped gratings or grooves. The V-shaped gratings or grooves may provide/create a pre-tilted surface for disposing a photoluminescent unit stack thereon. In some embodiments, the front surface of the polarizer may include a corrugated pattern. Such a structure may provide flexibility regarding the period and the design of the grid elements. The period and the overall design may be selected in light of the wavelength of the light emitting material and the degree of polarization.

The planar plasmon QD structure utilizes an oblique illumination in order to provide anisotropy luminance and thus is not suitable for front panel display. The photoluminescent polarizer of some embodiments described herein, includes the photoluminescent unit stack(s) that are disposed on a pre-tilted surface and may emit light from the front surface thereof by an excitation pump providing incident light to the second surface 70 (even perpendicular to the front plane) (for example, as shown in FIG. 3).

Figure 3:
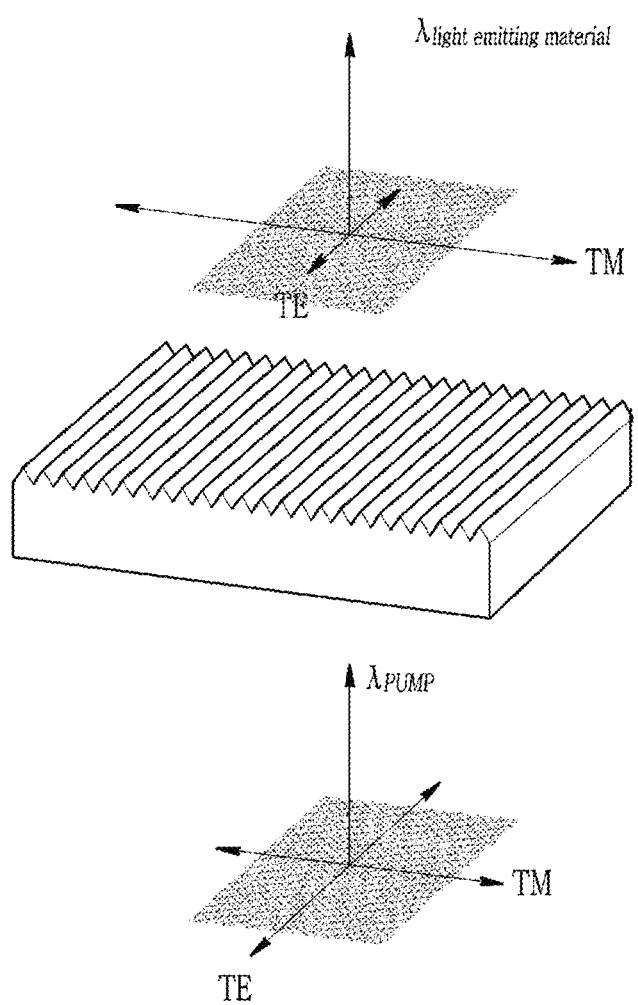
FIG. 3 is a view schematically illustrating an operating principle of a photoluminescent polarizer according to a non-limiting embodiment.

Referring to FIG. 3, the incident light emitted from the light source (e.g., light of wavelength $\lambda_{pump}$) is provided to the second surface of the photoluminescent polarizer and is converted into the light of wavelength $\lambda_{light\ emitting\ material}$ and emitted. The emitted light is polarized.

On the first lateral surface 30 and/or the second lateral surface 40, at least one (e.g., one, two, three, four, five, or more) photoluminescent unit stack(s) 50 may be disposed. The photoluminescent unit stack includes a light emitting film including a light emitting material and a metal film including a metal configured for (e.g., capable of) surface plasmon coupling, the metal film being disposed on at least one side of the light emitting film. The photoluminescent unit stack may include at least one spacer separating the light emitting film and the metal film. The spacer may include at least one layer including a polyelectrolyte that is transparent to light having a wavelength between 300 nm and 700 nm.

Figure 4:
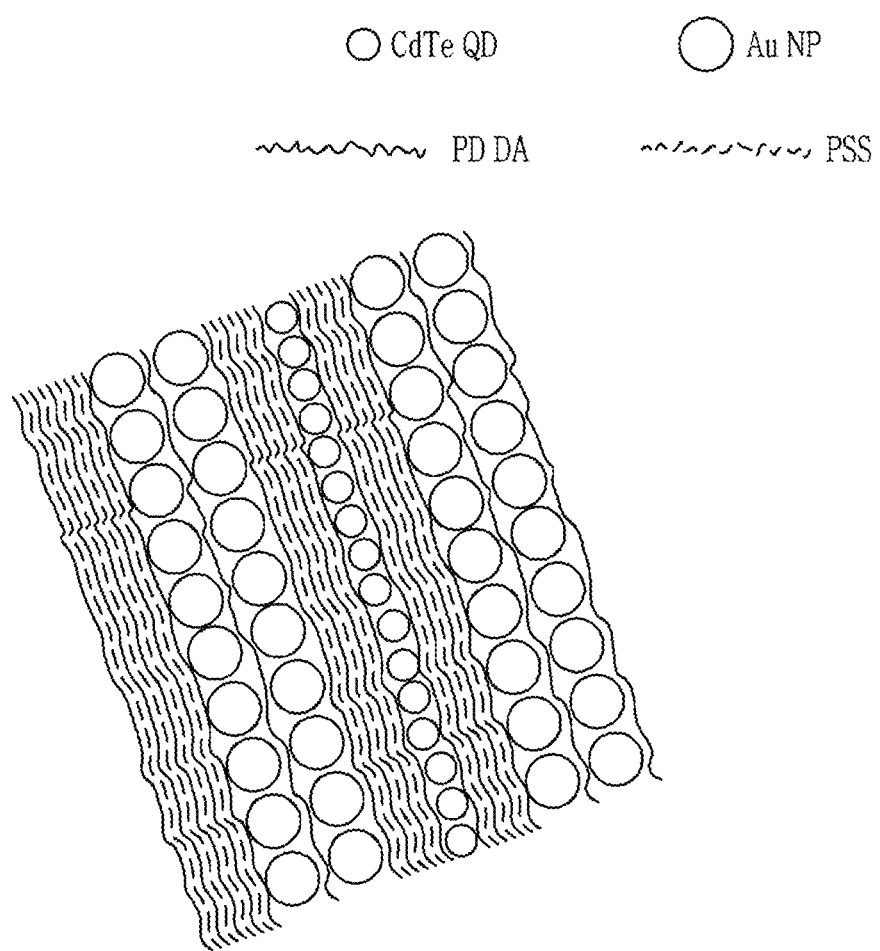
FIG. 4 is a view schematically illustrating a cross-section of a photoluminescent unit stack in a photoluminescent polarizer, according to a non-limiting embodiment.
Figure 5:
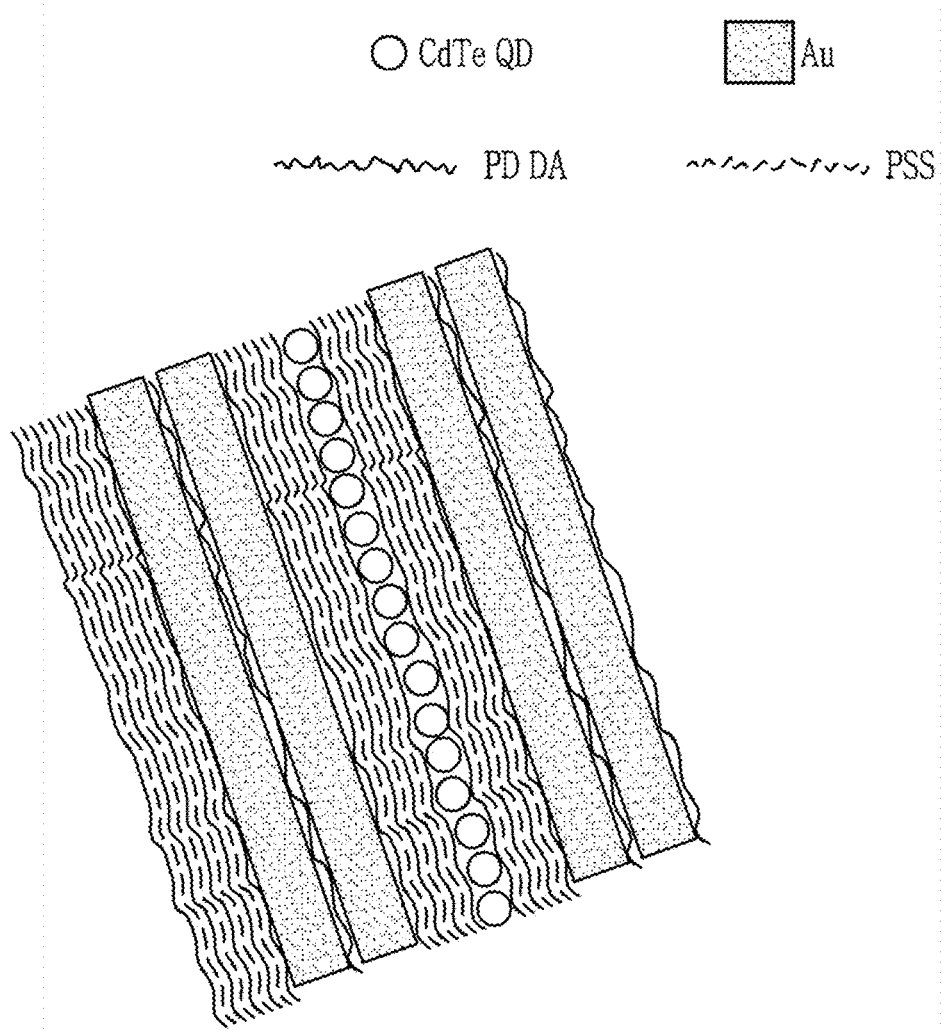
FIG. 5 is a view schematically illustrating a cross-section of a photoluminescent unit stack in a photoluminescent polarizer, according to another non-limiting embodiment.

FIG. 4 and FIG. 5 show cross-sections of a unit stack in a non-limiting embodiment. Referring to FIG. 4, the unit stack includes a metal film including a plurality of metal layers and a spacer disposed therebetween; and a light emitting film including quantum dots (e.g., CdTe quantum dots). The metal layer includes discontinuous layers each including a plurality of metal (Au) nanoparticles and a spacer including poly(diallyldimethylammonium chloride (PDDA) and/or polystyrene sulfonate (PSS) may be disposed between the discontinuous metal layers. In the unit stack, at least one spacer layers may be disposed between the light emitting film and the metal film.

Referring to FIG. 5, the unit stack includes a metal film including a plurality of metal layers and a spacer disposed therebetween; and a light emitting film including quantum dots. The metal film includes continuous metal deposition layers and a spacer including poly(diallyldimethylammonium chloride (PDDA) and/or polystyrene sulfonate (PSS) may be disposed between the continuous metal layers. In the unit stack, at least one spacer layers may be disposed between the light emitting film and the metal film.

In the photoluminescent unit stack, a thickness of the light emitting film may be greater than or equal to about 1 nm, for example, greater than or equal to about 2 nm, greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, or greater than or equal to about 10 nm, but is not limited thereto. A thickness of the light emitting film may be less than or equal to about 50 nm, for example, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 35 nm, less than or equal to about 30 nm, less than or equal to about 25 nm, or less than or equal to about 20 nm, but is not limited thereto.

In the photoluminescent unit stack, a thickness of the metal film may be greater than or equal to about 10 nm, for example, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, greater than or equal to about 20 nm, or greater than or equal about 25 nm. A thickness of the metal film may be less than or equal to about 150 nm, for example, less than or equal to about 100 nm, less than or equal to about 90 nm, less than or equal to about 80 nm, less than or equal to about 70 nm, less than or equal to about 60 nm, less than or equal to about 50 nm, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 35 nm, less than or equal to about 30 nm, less than or equal to about 25 nm, or less than or equal to about 20 nm, but is not limited thereto.

In the photoluminescent unit stack, a thickness of the spacer may be selected appropriately. In the photoluminescent unit stack, a metal film including a metal may be disposed on at least one surface (e.g., one or both surfaces) so closely that at least a portion of the light emitted from the light emitting material may be coupled (e.g., near-field coupled) with the surface plasmon of the metal. For example, the quantum efficiency of the semiconductor nanocrystal may decrease by the formation into a film and the luminous properties thereof may be isotropic. Without being limited by theory, properties and dynamics of emission of the light emitting material (e.g., a semiconductor material) may be modified by the oscillating plasmon of the closely disposed metal and they are susceptible to polarization of the incident optical excitation, thus bringing about local field enhancement, provided that there is a small gap between the metal film and the light emitting film for vertical polarization of excitation. In some embodiments, the spacer may provide such small gap in the photoluminescent unit stack. The spacer may include a polyelectrolyte comprising a cation, an anion, or a combination thereof. More specifically, the spacer may include a cationic polyelectrolyte (e.g., a polyelectrolyte having a cation), an anionic polyelectrolyte (e.g., a polyelectrolyte having an anion), or a combination thereof.

In some embodiments, the cationic polyelectrolyte may include a cation including $NR_4^+$ (where each R is independently hydrogen or a C1 to C10 alkyl group), $Na^+$, $K^+$, $Ca^{2+}$, $Mg^{2+}$, or a combination thereof, for example, in a repeating unit thereof. The anionic polyelectrolyte may include an anion including a halide, COO—, $SO_4^{2-}$, $SO_3^-$, $HPO_3^-$, or a combination thereof, for example, in a repeating unit thereof.

The spacer may include at least two layers each including the polyelectrolyte. Two adjacent layers including the polyelectrolyte may have opposite charges with respect to each other. The polyelectrolyte may include poly(diallyldimethylammonium chloride), poly(diallyldimethyl sulfonium chloride), polystyrene sulfonate, or a combination thereof.

The light emitting material may emit unpolarized light. The light emitting material (e.g., nanorods, nanoplatelets, and the like) may emit polarized light. The light emitting material may include a semiconductor nanocrystal, a nanosized inorganic phosphor, an organic dye, or a combination thereof. The nanosize inorganic phosphor, for example, may be an inorganic phosphor having a dimension, such as a diameter, or a length, or a width dimension, of 1000 nm or less.

In some embodiments, the light emitting material may include a semiconductor nanocrystal particle. The light emitting material may absorb light having a wavelength from the ultraviolet (UV) range to visible light range (e.g., 200 nm to 690 nm) and may emit light having a longer wavelength than a wavelength of the absorption light, for example, light in a blue, green, or red light region. For example, the light emitting material may absorb light having a wavelength of about 300 nm to about 690 nm and may emit light having a wavelength of about 450 nm to about 700 nm.

The semiconductor nanocrystal may have a particle size (e.g., a dimension) of 2 nm to 12 nm, and the semiconductor nanocrystal may absorb light having a wavelength between about 300 nanometers to about 690 nanometers and emit light of a wavelength longer than that of the absorbed light (e.g., a wavelength of between about 450 nanometers and about 700 nanometers). The luminescent wavelength of the semiconductor nanocrystal may depend on the composition and the size of the nanocrystal. The semiconductor nanocrystal may include a quantum dot, a nanorod, a nanoplatelet, or a combination thereof.

In an embodiment, the semiconductor nanocrystal may include a core including a first nanocrystal, and a shell disposed on (e.g., surrounding) the core and including a crystalline or an amorphous material. The shell may be a multi-layered shell, each layer of which includes the same crystalline or amorphous material, or different crystalline or amorphous materials.

The semiconductor nanocrystal may be a Group II-VI compound, a Group III-V compound, a Group IV-VI compound, a Group IV element or compound, a Group compound, a Group II-IV-VI compound, or a combination thereof.

In such an embodiment, the first nanocrystal may include a Group II-VI compound, a Group III-V compound, a Group IV-VI compound, a Group IV element or compound, a Group compound, a Group II-IV-VI compound, or a combination thereof. The crystalline or amorphous material of the shell may have the same composition as the first nanocrystal or may have a different composition from the first nanocrystal. The crystalline or amorphous material of the shell may include a Group II-VI compound, a Group III-V compound, a Group IV-VI compound, a Group IV element or compound, a Group compound, a Group II-IV-VI compound, or a combination thereof.

In one embodiment, for example, the Group II-VI compound may include at least one of:

a binary element compound including CdSe, CdTe, ZnS, ZnSe, ZnTe, ZnO, HgS, HgSe, HgTe, MgSe, MgS, or a combination thereof;

a ternary element compound including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; or a quaternary element compound including HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof. The Group II-VI compound may further include a Group III metal.

In one embodiment, for example, the Group III-V compound may include at least one of:

a binary element compound including GaN, GaP, GaAs, GaSb, AlN, AlP, AlAs, AlSb, InN, InP, InAs, InSb, or a combination thereof;

a ternary element compound including GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; or a quaternary element compound including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof. The Group III-V compound may further include a Group II metal (e.g., InZnP).

In one embodiment, for example, the Group IV-VI compound may include at least one of:

a binary element compound including SnS, SnSe, SnTe, PbS, PbSe, PbTe, or a combination thereof;

a ternary element compound including SnSeS, SnSeTe, SnSTe, PbSeS, PbSeTe, PbSTe, SnPbS, SnPbSe, SnPbTe, or a combination thereof; or a quaternary element compound including SnPbSSe, SnPbSeTe, SnPbSTe, or a combination thereof.

Examples of the Group compound may include $CuInSe_2$, $CuInS_2$, CuInGaSe, CuInGaS, or a combination thereof, but are not limited thereto.

Examples of the Group II-IV-VI compound may include CuZnSnSe, CuZnSnS, or a combination thereof, but are not limited thereto.

The Group IV element or compound may include:

an elementary substance including Si, Ge, or a combination thereof; or a binary element compound including SiC, SiGe, or a combination thereof.

The binary element compound, the ternary element compound, or the quaternary element compound may be respectively included in a uniform concentration or in partially different concentrations within the same particle. In the core-shell semiconductor nanocrystal particle, the materials of the shell may have a larger bandgap than the energy bandgap of the core, or vice versa. In the case of the multi-layered shell, the bandgap of the material of an outer layer of the shell may have a larger energy than the bandgap of the material of an inner layer of the shell (a layer that is closer to the core). At the interface between the core and the shell, an alloy interlayer may be present, or may not be present. When the quantum dot includes an alloy interlayer, the interface between the core and the shell may have a concentration gradient, wherein the concentration of an element of the shell changes (e.g., decreases or increases) from an outer surface of the shell toward the core. In addition, the shell may include a multi-layered shell having at least two layers. In the multi-layered shell, each layer may have a single composition, an alloy, or a composition having a concentration gradient.

The semiconductor nanocrystal may have a particle diameter of about 1 nm to about 100 nm. In the case of a non-spherically shaped particle, the diameter of the semiconductor nanocrystal is calculated from a two dimensional TEM image area under assumption that the image becomes a circle. For example, the quantum dot may have a particle diameter of about 1 nm to about 20 nm, for example, from about 2 nm to about 15 nm, or from about 3 nm to about 15 nm. In some embodiments, the semiconductor nanocrystal have a diameter of greater than or equal to about 2 nm, greater than or equal to about 3 nm, greater than or equal to about 4 nm, or greater than or equal to about 5 nm, and a diameter of less than or equal to about 50 nm, less than or equal to about 45 nm, less than or equal to about 40 nm, less than or equal to about 35 nm, less than or equal to about 30 nm, less than or equal to about 25 nm, less than or equal to about 20 nm, less than or equal to about 15 nm, less than or equal to about 10 nm, less than or equal to about 9 nm, less than or equal to about 8 nm, or less than or equal to about 7 nm.

The semiconductor nanocrystal may have any shape, and is not particularly limited. For example, the semiconductor nanocrystal may be spherical, ellipsoidal, pyramidal, multi-armed, or cubic nanoparticles, nanotubes, nanowires, nanofibers, nanoplate particles, or a combination thereof, or the like.

The semiconductor nanocrystal (hereinafter, also referred to as a quantum dot) is commercially available or may be synthesized by any suitable method. For example, a nano-sized semiconductor nanocrystal may be synthesized by a wet chemical process. In the wet chemical process, precursors react in an organic solvent to grow nanocrystal particles, and the organic solvent or a ligand compound may coordinated (or be bound) to the surface of the semiconductor nanocrystal, thereby controlling the growth of the nanocrystal. Examples of the organic solvent and the ligand compound are not limited, and any suitable organic solvent and/or ligand compound may be used. The organic solvent coordinated to the surface of the quantum dot may affect the stability of a device, and thus, excess organic materials that are not coordinated to the surface of the quantum dot may be removed by pouring the quantum dot into an excessive amount of a non-solvent, and centrifuging the resulting mixture. Examples of the non-solvent may be acetone, ethanol, methanol, and the like, but are not limited thereto.

The semiconductor nanocrystal may have an organic ligand bound to a surface thereof. The organic ligand may include a hydrophobic moiety. In an embodiment, the organic ligand may include RCOOH, $RNH_2$, $R_2NH$, $R_3N$, RSH, $R_3PO$, $R_3P$, ROH, RCOOR', $RPO(OH)_2$, $R_2POOH$ (wherein R and R' are independently a substituted or unsubstituted C5 to C24 aliphatic group such as a substituted or unsubstituted C5 to C24 alkyl or C5 to C24 alkenyl group, or a substituted or unsubstituted C5 to C20 aromatic group such as an aryl group), a polymeric organic ligand, or a combination thereof.

Examples of the organic ligand compound may include:

thiol compounds including methane thiol, ethane thiol, propane thiol, butane thiol, pentane thiol, hexane thiol, octane thiol, dodecane thiol, hexadecane thiol, octadecane thiol, benzyl thiol, or a combination thereof;

amine compounds including methylamine, ethylamine, propylamine, butylamine, pentylamine, hexylamine, octylamine, nonylamine, decylamine, dodecylamine, hexadecylamine, octadecylamine, dimethylamine, diethylamine, dipropylamine, tributylamine, trioctylamine, or a combination thereof;

carboxylic acid compounds including methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, or a combination thereof;

phosphine compounds including methyl phosphine, ethyl phosphine, propyl phosphine, butyl phosphine, pentyl phosphine, octyl phosphine, dioctyl phosphine, tributyl phosphine, trioctyl phosphine, or a combination thereof;

phosphine oxide compounds including methyl phosphine oxide, ethyl phosphine oxide, propyl phosphine oxide, butyl phosphine oxide, pentyl phosphine oxide, tributyl phosphine oxide, octylphosphine oxide, dioctyl phosphine oxide, trioctyl phosphine oxide, or a combination thereof;

diphenyl phosphine, triphenyl phosphine, oxide compounds thereof, or a combination thereof;

a C5 to C20 alkylphosphinic acid such as hexylphosphinic acid, octylphosphinic acid, dodecylphosphinic acid, tetradecylphosphinic acid, hexadecylphosphinic acid, octadecyl phosphinic acid, or a combination thereof;

a C5 to C20 alkylphosphonic acid; and the like, but are not limited thereto. A combination comprising at least one of the foregoing organic ligands may also be used. The quantum dot may include the hydrophobic organic ligand alone or as a mixture of two or more.

The semiconductor nanocrystal may have a quantum yield (or a quantum efficiency) of greater than or equal to about 10%, for example, greater than or equal to about 30%, greater than or equal to about 50%, greater than or equal to about 60%, greater than or equal to about 70%, greater than or equal to about 90%, or even about 100%. The quantum dot may have a narrow full width half maximum (FWHM) of the photoluminescent spectrum. For example, the quantum dot may have a FWHM of less than or equal to about 45 nm, for example, less than or equal to about 40 nm, or less than or equal to about 30 nm.

In an embodiment, the light emitting material may include a nanosized inorganic phosphor. The nano-sized inorganic phosphor may be an inorganic phosphor having a size of less than or equal to about 500 nm, for example, about 10 nm to about 100 nm. As used herein, the term "nano-sized" or "nano-size" refers to a particle size in which the longest dimension (e.g., length) across the given particle (hereinafter, the longest diameter) or an average value thereof is less than about 1 um (i.e., less than 1,000 nm). The size of the phosphor may be determined by scanning electron microscopy ("SEM") analysis. For example, in the SEM image of the inorganic phosphor, if the average longest diameter is less than or equal to about 1 um, the phosphor may be determined to be a nano-sized phosphor. The nano-sized inorganic phosphor may absorb light having a wavelength of about 200 nm or longer (e.g., in a range between about 200 nm to about 400 nm) in order to emit light within the visible light range. The composition of the nano-sized inorganic phosphor is not particularly limited and may have any suitable composition. In such an embodiment, the nano-sized inorganic phosphor may include a blue light emitting inorganic phosphor (e.g., $BaMg_2Al_{16}O_{27}:Eu^{2+}$), a green light emitting inorganic phosphor (e.g., $CeMgAl_{11}O_{19}:Tb^{3+}$), or a red light emitting inorganic phosphor (e.g., $Y_2O_3:Eu^{3+}$). In one embodiment, for example, the blue light emitting inorganic phosphor may include: $(Ba,Sr,Ca)_5(PO_4)_3(Cl,F,OH):Eu^{2+}$, $(Ba,Sr,Ca)MgAl_{10}O_{17}:Eu^{2+}$, or $(Ba,Sr,Ca)BPO_5:Eu^{2+}$. In one embodiment, for example, a blue-green light emitting inorganic phosphor may include: $Sr_4Al_{14}O_{25}:Eu^{2+}$, $BaAl_8O_{13}:Eu^{2+}$, $2SrO.0.84P_2O_5.0.16B_2O_3:Eu^{2+}$; $MgWO_4$, $BaTiP_2O_8$; $(Ba,Sr,Ca)MgAl_{10}O_{17}:Eu^{2+}$, $Mn^{2+}$, or $(Ba,Sr,Ca)_5(PO_4)_3(Cl,F,OH):Sb^{3+}$. In one embodiment, for example, a green light emitting inorganic phosphor may include: $LaPO_4:Ce^{3+}$, $Tb^{3+}$, $GdMgB_5O_{10}:Ce^{3+},Tb^{3+},Mn^{2+}$, or $GdMgB_5O_{10}:Ce^{3+}$, $Tb^{3+}$. In one embodiment, for example, an yellow-orange light emitting inorganic phosphor may include $(Tb,Y,Lu,La,Gd)_3(Al,Ga)_5O_{12}:Ce^{3+}$, or $(Ba,Sr,Ca)_5(PO_4)_3(Cl,F,OH):Eu^{2+}$, $Mn^{2+}$, $Sb^{3+}$. In one embodiment, for example, the red light emitting inorganic phosphor may include: $(Y,Gd,La,Lu,Sc)_2O_3:Eu^{3+}$, $(Y,Gd,La,ln,Lu,Sc)BO_3:Eu^{3+}$, $(Y,Gd, La)(Al,Ga)O_3:Eu^{3+}$, $(Ba,Sr,Ca)(Y,Gd, La, Lu)_2O_4:Eu^{3+}$, $(Y,Gd)Al_3B_4O_{12}:Eu^{3+}$, monoclinic $Gd_2O_3:Eu^{3+}$, $(Gd,Y)_4(Al,Ga)_2O_9:Eu^{3+}$, $(Ca,Sr)(Gd,Y)_3(Ge,Si)Al_3O_9:Eu^{3+}$, $(Sr,Mg)_3(PO_4)_2:Sn^{2+}$, $GdMgB_5O_{10}:Ce^{3+},Mn^{2+}$, or $3.5MgO.0.5MgF_2.GeO_2:Mn^{4+}$. A combination comprising at least one of the foregoing inorganic phosphors may also be used. However, the nano-sized inorganic phosphor is not limited to the material listed above. Methods of manufacturing such a nano-sized inorganic phosphor are known in the art.

In an embodiment, the light emitting material may include an organic dye. In such an embodiment, the organic dye may include an organic dye having light-emitting properties, and types thereof are not particularly limited. In one embodiment, for example, the organic dye may include an organic fluorescent dye and/or an organic phosphorescent dye. In one embodiment, for example, the organic dye may include an organic metal complex or an organic colorant. In an embodiment, the organic dye may include an organo-metal complex type dye such as tris(2-phenylpyridine)iridium or an organic dye comprising (or, alternatively, consisting of) an organic material such as coumarin, rhodamine, phenoxazone, stilbene, terphenyl, quaterphenyl, or a combination thereof, for example.

The light emitting film may include a plurality of layers each including the light emitting material and a spacer (e.g., a spacer layer) including a polyelectrolyte may be interposed between two adjacent layers of the plurality of layers of the light emitting material. The spacer may be disposed directly on a surface of the light emitting material layer of the plurality of layers. In some embodiments, the surface of the semiconductor nanocrystal and the polyelectrolyte may be oppositely charged with respect to each other. Details of the spacer and the polyelectrolyte are the same as set forth above.

In the photoluminescent unit stack, the metal film is disposed on at least one (e.g., one or both) surface(s) of the light emitting film and includes a metal that can be plasmon-coupled with the light emitting material. The metal may include gold, silver, copper, platinum, aluminum, or a combination thereof. The type of metal may be selected considering the absorption/emission wavelength and the composition of the light emitting material. For example, in case of a red light emitting semiconductor nanocrystal, the metal film may include gold, silver, or a combination thereof. In case of green light emitting semiconductor nanocrystal, the metal film may include gold.

The metal film may include at least one continuous metal layer consisting of the metal. The metal film may include at least one discontinuous metal layer including a plurality of nano-sized particles comprising the metal. A combination of the at least one continuous metal layer and the at least one discontinuous metal layer may also be used. A thickness of the continuous metal layer and the discontinuous metal layer may be, independently, less than or equal to about 20 nm, for example, 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, or less than or equal to about 11 nm. A thickness of the continuous metal layer and the discontinuous metal layer may be, independently, greater than or equal to about 1 nm, greater than or equal to about 2 nm, greater than or equal to about 3 nm, greater than or equal to about 4 nm, or greater than or equal to about 5 nm. The metal film may include at least two metal layers, and at least two adjacent layers may include a spacer layer including a polyelectrolyte interposed therebetween.

The continuous metal layer may be formed via a physical or a chemical (vapor) deposition method under suitable conditions. The discontinuous metal layer may include a metal nanoparticle. The metal nanoparticles are commercially available or may be prepared via a colloidal synthesis method entailing thermal decomposition of a metal precursor in a solvent in the presence of a surface stabilizer. Details of the colloidal synthesis method of preparing the metal nanoparticle are known and the details thereof may be determined by the person of skill in the art without undue experimentation. For example, a solution (or dispersion) including the metal nanoparticles may be applied and a solvent is removed to form a discontinuous metal layer including metal nanoparticles.

The photoluminescent polarizer may linearly polarize at least a portion of light emitted from the light emitting material. The photoluminescent polarizer may linearly polarize at least a portion of the incident light. The incident light may be irradiated at an arbitrary angle (even perpendicular) relative to the second surface of the polarizer. The photoluminescent polarizer of the embodiments described herein is able to polarize light even if the incident light is not oblique illumination. The linearly polarized light may be emitted from the first surface (i.e., the front surface) of the photoluminescent polarizer.

In the case of the photoluminescent polarizer according to the embodiments, inherent optical losses (such as absorption and reflection losses) may be compensated for by the plasmon-exciton coupling, resulting in plasmonically enhanced highly polarized emission. The photoluminescent polarizer of the embodiments does not work on the principle of eliminating a significant portion of a single polarization state while allowing for the other polarization. Rather, without being limited by theory, the photoluminescent polarizer of the embodiments may enforce the light emitting material, such as a semiconductor nanocrystal, to emit light in a single polarization state due to the increased photoluminescence rate to that state which occurs during plasmonic coupling. Thus, unlike other polarizing architectures, increased emission of the photoluminescent polarizer of the embodiments may make the same unique with great performance.

The photoluminescent polarizer of the embodiments may have selective absorption and reflection properties. It is believed that in the photoluminescent polarizer of the embodiments, the transverse magnetic (TM) wave may be efficiently coupled to the composite structure. The incident electromagnetic excitation may be either transmitted or absorbed (which will be coupled to the QDs plasmonically through near-field interactions). However, the transverse electric (TE) wave may not be transmitted or absorbed, but instead, may be almost completely reflected. These selective absorption and reflection characteristics are another promising aspect of the photoluminescent polarizer of the embodiments as an application for backlight displays. Without being limited by theory, when the photoluminescent polarizer of the embodiments is excited with an unpolarized light source, the TE polarization may be mostly reflected back. Thus, using back-reflector architecture it may be possible to harvest the reflected portion of the excitation source. Distributed Bragg reflectors (DBR) may be used as back-reflectors without causing metallic losses and letting excitation wavelengths to pass, by specially engineering the back-reflectors to reflect only the quantum dot emission wavelength. This architecture may lead to a further increase in the efficiency of the nanocomposite in addition to the efficiency increase from the plasmonic enhancement of the QD layer.

The polarizer of the embodiments may be prepared by a method comprising: preparing a mold for a structure including a base and a plurality of grid elements, wherein a grid element of the plurality of grid elements includes a first lateral face and a second lateral face, using the mold to form the structure, and forming a photoluminescent unit stack on the first lateral face, the second lateral face, or a combination thereof. Details for the base and the grid elements are the same as set forth above.

In some embodiments, the structure having the base and the plurality of grid elements may be prepared by obtaining a mold with a pattern having a pitch and a height that correspond to those of a desired grid element structure and forming (e.g., replicating) a structure having a base and a plurality of grid elements from the mold. FIGS. 6A to 6F show a non-limiting exemplary process for preparing the structure. Referring to FIGS. 6A to 6F, a bilayer PMMA resist 210 pattern is formed on a mold substrate 200 (e.g., a silicon substrate) by using E-beam lithography (Step 1; FIG. 6A); forming a Cr mask layer 250 on the mold substrate 200 having the bilayer PMMA resist pattern 210 (Step 2; FIG. 6B); lifting off the PMMA resist pattern 210 and patterning the substrate using a shallow Deep Reactive Ion Etching (DRIE) (Step 3; FIG. 6D), and conducting an anisotropic KOH etching to obtain a silicon mold (Step 4; FIG. 6D). If desired, an anti-adhesion layer (not shown) is formed on the obtained silicon mold. Then, a replica of the base material 260 (e.g., PDMS) may be drop-casted on the silicon mold optionally having the anti-adhesion layer (Step 5; FIG. 6E). Finally, the replica of the base material is separated from the mold, for example via adhesion to a predetermined support 270 such as a glass substrate or a polymer substrate, to form the aforementioned structure (Step 6; FIG. 6E).

Then, a metal film may be formed on the first and/or the second lateral surface of the formed plurality of grid elements, optionally a spacer may be formed thereon, and a light emitting film may be applied thereon to form a photoluminescent unit stack.

Figure 7:
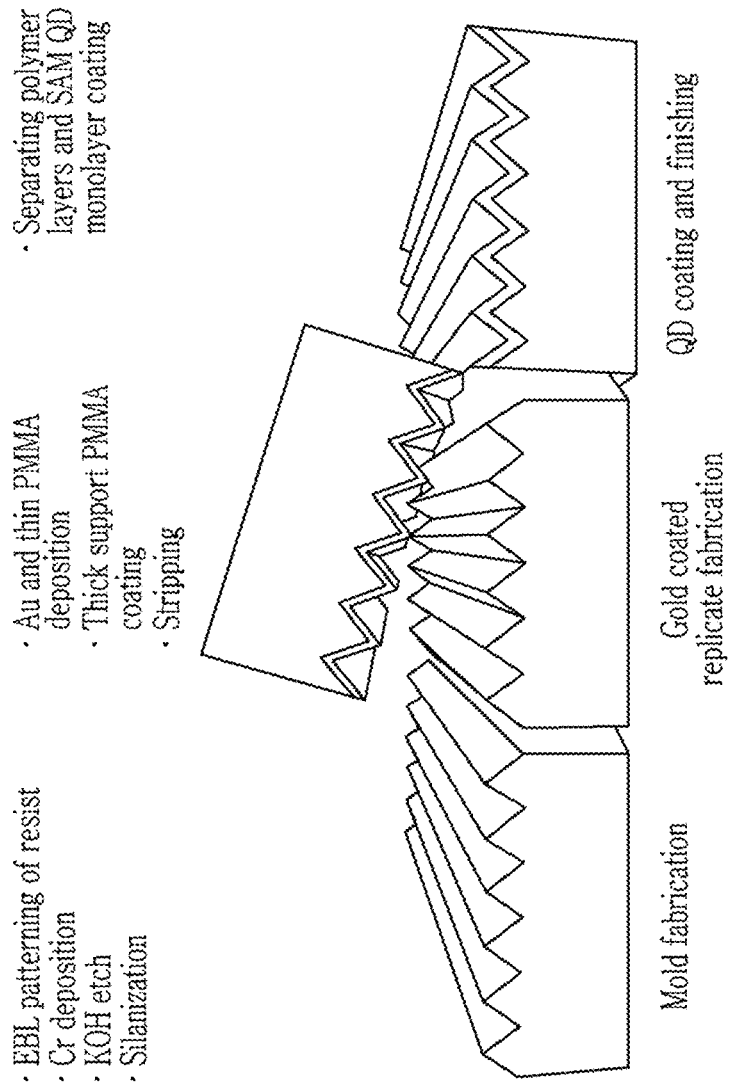
FIG. 7 is a view schematically illustrating a production process for preparing a structure including a base and a grid element for a photoluminescent polarizer, according to another non-limiting embodiment.

In some embodiments, formation of the anti-adhesion layer may be made by treating a surface of the mold with a silane compound, but is not limited thereto. In other non-limiting embodiments, a metal film is formed on the anti-adhesion layer and a replica of the base material may be drop-casted on the metal film. Another embodiment is illustrate in FIG. 7. Referring to FIG. 7, gold bilayers separated with a very thin (~6 nm) PMMA layer are formed on the mold. These layers are peeled from the mold using thick (in the order of microns) PMMA layer as support layer. Separating polymer and QD layers are coated on the replicate.

The light emitting film may include a monolayer including a semiconductor nanocrystal (e.g., quantum dots). The monolayer including the semiconductor nanocrystal may be formed by applying (coating) a dispersion including a solvent and semiconductor nanocrystal particles on the first and/or second lateral surface(s) and removing the solvent therefrom, but it is not limited thereto. In other embodiments, an organic solvent dispersion of the semiconductor nanocrystal particles (e.g., a toluene dispersion of the quantum dots) may be dropped on a Teflon well containing a solvent (e.g., ethylene glycol) that is not miscible with the organic solvent to obtain a mixture, and then the toluene may be slowly evaporated to from the mixture to form a uniform semiconductor nanocrystal monolayer, which is then transferred to the first and/or second lateral surface via stamping.

The spacer may be formed by preparing a solution including a solvent and a polyelectrolyte at a predetermined concentration, applying the solution on a metal film (or a metal layer) or a light emitting film (or light emitting layer), and then removing the solvent therefrom. The concentration of the polyelectrolyte and the application method may be selected appropriately.

In the foregoing method, details for the base, the grid element, the metal film (the metal layer), the light emitting material, the spacer, and the polyelectrolyte are the same as set forth above.

The photoluminescent polarizer of the embodiments may be used as a photoconversion layer, a backlight unit, or a color filter in a display device that utilizes an external light source.

In still another embodiment, an electronic device includes a light source and a photoluminescent polarizer. The photoluminescent polarizer may be disposed in the electronic device such that the second surface of the base receives incident light from the light source and linearly-polarized light may be emitted from the front surface of the polarizer. Referring back to FIG. 3, in such an embodiment, the photoluminescent polarizer may be disposed in the electronic device in such a manner that the light of a first wavelength (e.g., $\lambda_{pump}$) may excite the light emitting material to emit light of a second wavelength (e.g., $\lambda_{light\ emitting\ material}$) as linearly polarized light from the front surface of the polarizer.

The electronic device may be a light emitting diode, an organic light emitting diode, a solar cell electronic device, a backlight unit, or a liquid crystal display, for example.

Figure 8A:
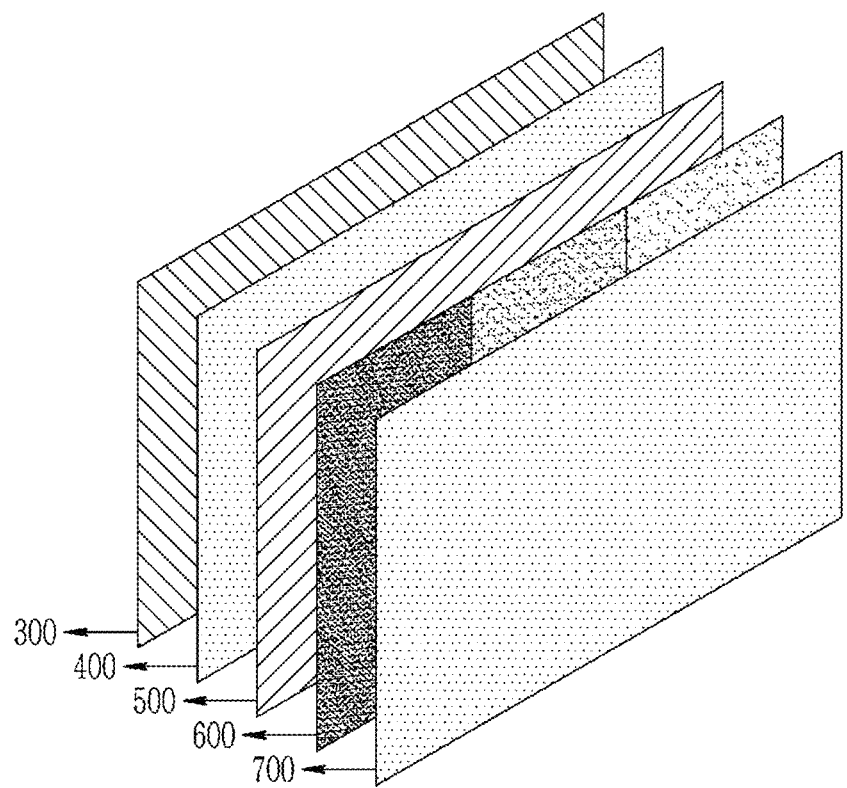
FIG. 8A is an exploded view schematically illustrating an electronic device (e.g., a LCD), according to a non-limiting embodiment.

In one embodiment, for example, the electronic device may be an LCD panel 1000, as schematically illustrated in FIG. 8A, including a backlight unit 300, a first polarizer 400, a liquid crystal layer 500, a color filter 600, and a second polarizer 700, but it is not limited thereto. The photoluminescent polarizer of the embodiments may be included in the backlight unit and thereby at least one of the first and the second polarizer may be omitted from the LCD device. Detailed structures of such an electronic device are known, and detailed description thereof will be omitted. An embodiment of the optical element according to the invention may be included in a wavelength conversion element, an element for polarization, a backlight unit, or the like, but it is not limited thereto.

Figure 8B:
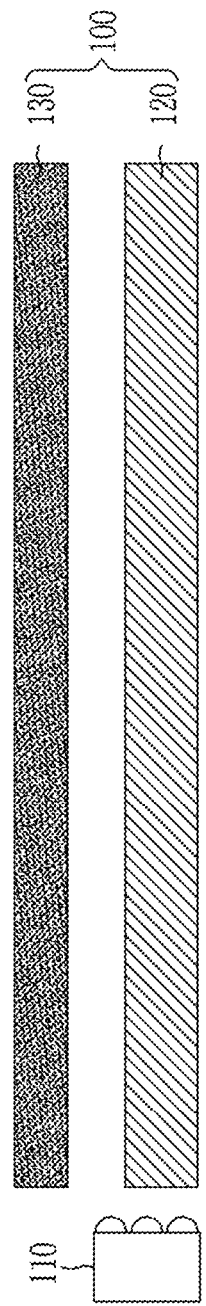
FIG. 8B is a schematic view of a cross-section of a backlight unit according to a non-limiting embodiment.

FIG. 8B is a schematic view of an edgy type backlight unit 100 including a photoluminescent polarizer in accordance with an embodiment. Alternatively, the photoluminescent polarizer of the embodiment may form a direct type BLU. Referring to FIG. 8B, the backlight unit 100 includes a light emitting diode ("LED") light source 110, a photoluminescent polarizer 130 to convert light emitted from the LED light source 110 to polarized light having a different wavelength(s), and a light guide panel 120 disposed therebetween to guide the light emitted from the LED light source 110 to the photoluminescent polarizer 130. The LED light source 110 includes a plurality of LED chips emitting light having predetermined wavelengths.

The LED light source 110 may be a blue light-emitting LED light source or an ultraviolet (UV)-emitting LED light source. A reflector (not shown) may be further disposed on the lower surface of the light guide panel 120. In case of a direct type BLU, the light source provide light directly with the photoluminescent polarizer 130 and the light guide panel 120 may be omitted.

The photoluminescent polarizer 130 is spaced apart from the LED light source 110 by a predetermined distance and converts light emitted from the LED light source 110 to the polarized light having a different wavelength, which is then transmitted to a liquid crystal panel. Materials and structures for each of the LED light source 110 and the light guide panel are known in the art and are commercially available, and thus are not particularly limited.

Hereinafter, embodiments of the invention will be described in greater detail with reference to specific examples. However, the examples below are exemplary embodiments of the invention, and the invention is not limited thereto.

EXAMPLES

Reference Example 1: Production of CdTe QD Nanocrystal 4.59 grams (g) of $Cd(ClO_4)_2$ is dissolved in 0.2 liter (L) of MILLI-Q® water (ultrapure water) to prepare a solution (Step 1), with which 0.3 L of a solution including MILLI-Q® water and 1.31 g of thioglycolic acid ("TGA") are mixed in a first flask (Step 2) to form 0.5 L of a mixed solution. Then, by the addition of NaOH thereto with vigorous stirring, the resulting mixture having a pH of 12 is prepared as a Cd-containing solution. In a glove box, 0.8 g of $Al_2Te_3$ is placed in a second flask while argon gas is flowed thereinto. A sulfuric acid solution is prepared by mixing 10 mL of 0.5 M $H_2SO_4$ with 15 mL of MILLI-Q® water. The second flask is connected to the first flask and the sulfuric acid solution is added to the $Al_2Te_3$ and the argon gas is used as a carrier to provide $H_2Te$ gas. After 30 minutes, the $Al_2Te_3$ line is disconnected and the reaction system is heated to 100° C. for the solution to boil, thereby quantum dots are grown and their size increases. The photoluminescent spectrum thereof is red-shifted. The prepared quantum dots are recovered and the obtained CdTe quantum dots (QD) are negatively charged.

Example 1: Production of Corrugated PDMS Structure (Replica)

A corrugated PDMS structure (replica) is obtained according to the method illustrated in FIGS. 6A to 6F.

On a silicon substrate, a 200 nm thick PMMA bilayer (495 K molecular weight at the bottom and 950 K molecular weight at the top) is coated using spin coating. A 50 nm chromium layer is deposited via electron beam deposition. The PMMA layer having the chromium layer thereon is lifted off by using dichloroethane and the shallow deep reactive etching is conducted to pattern the silicon substrate. For the wet etching, IPA is added to KOH etch recipe in order to decrease an etch rate. The remaining chromium layer plays a role of a protective mask layer while an anisotropic KOH etching is conducted at a temperature of 40° C. at an etch rate of 70 nm/min to obtain a mold having a corrugated surface. In the corrugated surface, the first lateral faces and the second lateral faces are angled toward each other to form a plurality of trigonal (triangular) prisms arranged side by side at a predetermined pitch. For preparation of the KOH etch solution, the 20 wt % KOH is dissolved in 80 wt % $H_2O$:IPA (4:1). The scanning electronic microscopic image of the obtained mold is shown in FIG. 9.

Figure 9:
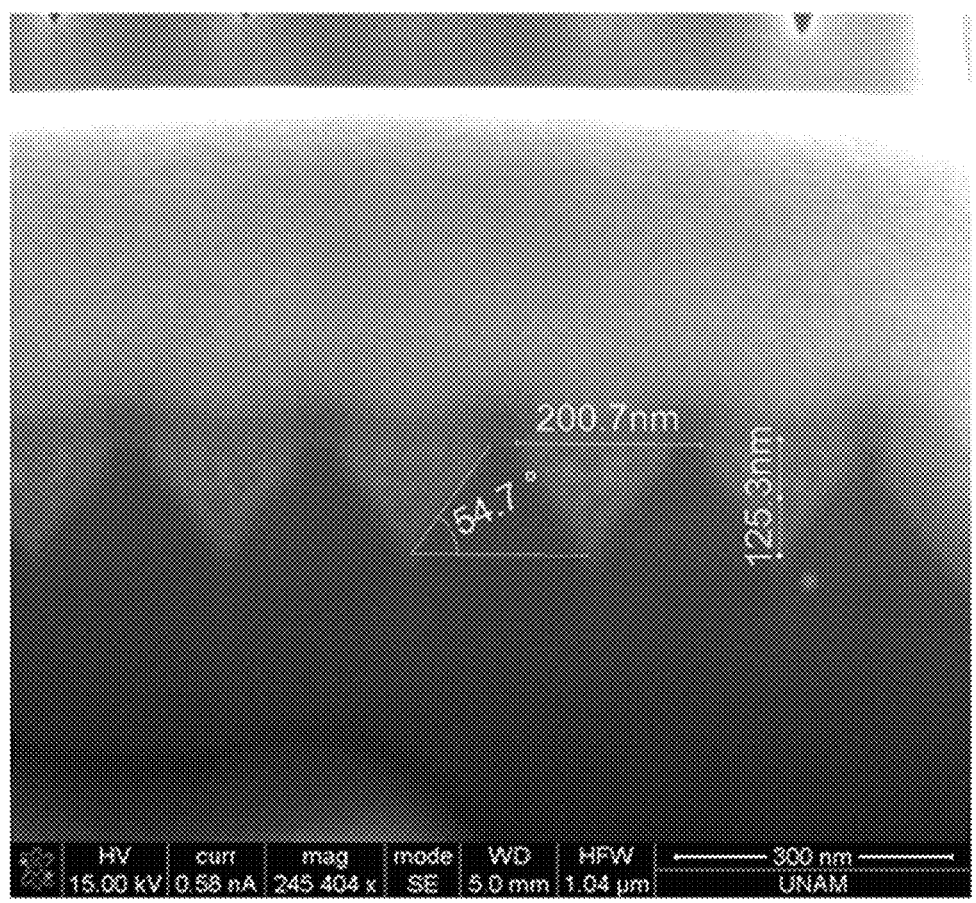
FIG. 9 is a scanning electron microscope (SEM) image of a cross-section of a structure including a base and a grid element prepared in accordance with Example 1.

FIG. 9 confirms that the pitch for the grid element is about 200.7 nm, the height for the grid element is about 125.3 nm, and angle A1 and angle A2 are determined to be 35.3 degrees since the angle between the (100) plane and the (111) plane of silicon is 54.7 degrees.

The surface of the obtained corrugated mold is subjected to silanization under $O_2$ atmosphere, and thereby a PDMS replica may be easily detached from the corrugated mold. In order to produce the PDMS replica, SYLGARD® 184 PDMS is mixed with a curing agent at a ratio of 10:1 and the resulting mixture is filled in the mold and cured at 60° C. for 12 hours. The PDMS replica is detached and obtained from the mold.

Example 2: Production of a Photoluminescent Unit Stack on the Corrugated PDMS Replica According to the method illustrated in FIGS. 6A to 6F, a PDMS replica having a corrugated surface is prepared as below.

On the PDMS replica is formed a 15 nm thick gold (Au) layer via electron beam deposition. Each of a PDDA solution and a PSS solution is prepared by dissolving poly(diallyldimethylammonium) chloride (PDDA) or polystyrene sulfonate (PSS), respectively. Each of the PDDA solution and the PSS solution is coated on the Au layer and the solvent is removed therefrom to form a spacer including the PDDA/PSS bilayer. A 15 nm thick gold (Au) layer is deposited on the spacer and then four PDDA/PSS bilayers are formed on the Au layer via a spin or dip coating. Then, a CdTe QD aqueous solution prepared in Reference Example 1 is prepared on the spacer and the solvent is removed to form a quantum dot monolayer. Another four PDDA/PSS bilayers are formed on the quantum dot monolayer to obtain a gold (Au)-spacer-CdTe unit stack.

The foregoing layer formation process is repeated two or three times to form a composite including two or three layered unit stacks on the first and the second lateral faces of the grid elements.

Figure 10:
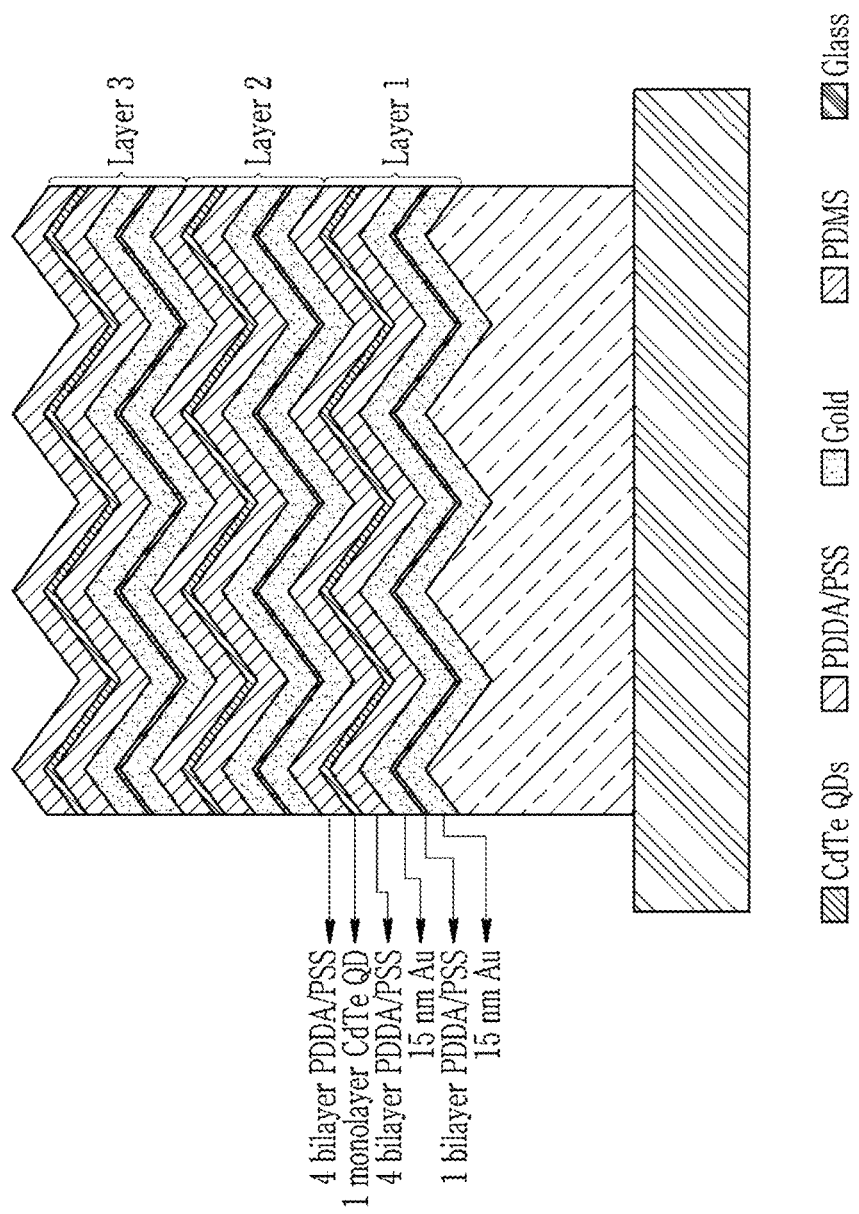
FIG. 10 is a scanning electron microscopic image of a cross-section of a photoluminescent polarizer prepared in accordance with Example 2.
Figure 11:
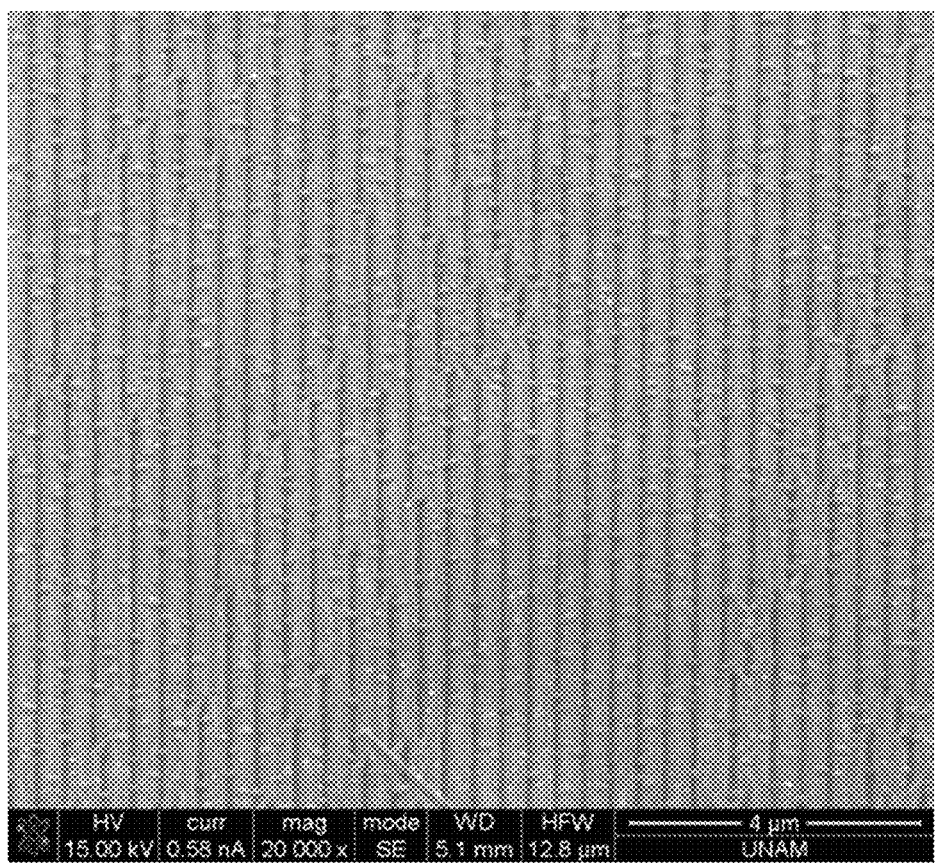
FIG. 11 is a scanning electron microscopic image of a front surface of a photoluminescent polarizer prepared in accordance with Example 2.

A schematic cross-section of the photoluminescent polarizer prepared by repeating the unit stack formation process three times is shown in FIG. 10. A scanning electron microscopic image of the front surface of the photoluminescent polarizer obtained by repeating the unit stack formation process two times is shown in FIG. 11.

Example 3-1

A polarization is measured for the photoluminescent polarizer prepared in Example 2.

To measure the degree of polarization of the light emitted from the fabricated sample of the patterned plasmonic-QD composite, a time-correlated single photon counting (TCSPC) technique is used and the time-resolved fluorescence emission for both horizontal and vertical polarizations are collected while the polarization of the excitation source is altered for vertical and horizontal.

Figure 12:
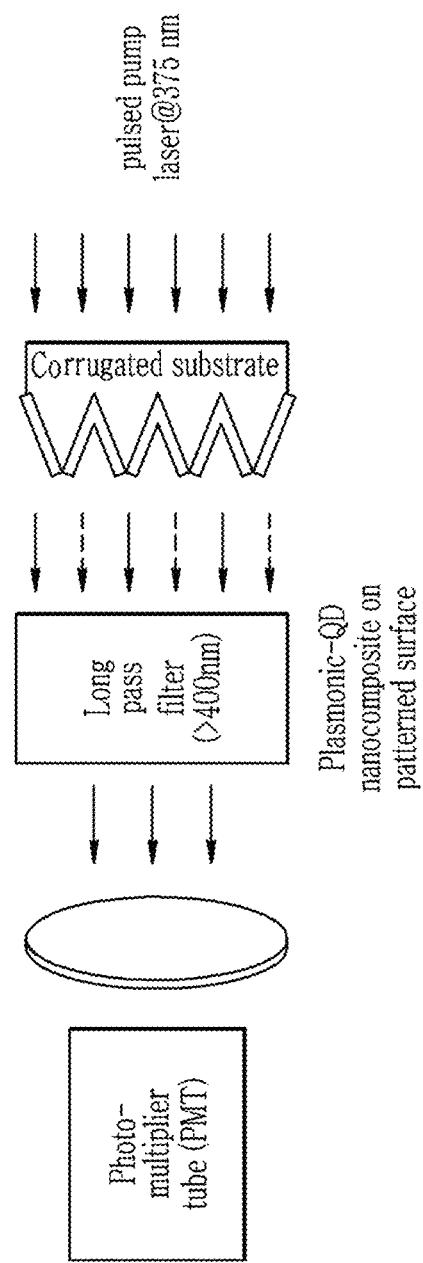
FIG. 12 is a view schematically illustrating a configuration of an experimental device for measuring a degree of polarization of a photoluminescent polarizer, as described in Example 3-1.

FIG. 12 shows the experimental setup. The excitation pump (pulsed pump) is positioned perpendicular to the front plane (and the second surface) of the polarizer. The light emitted from the corrugated surface side passes through a long-pass filter to block the excitation laser (at 375 nm). The filtered light, which is the fluorescence from the QDs in the composite, is collected with a collection lens and then passes through a rotatable polarizer. A photomultiplier tube (PMT) is used as the detector. The photon count is plotted as a function of time. The excitation source as used is 375 nm laser, the selected repetition rate is 5 megahertz (MHz). The temporal resolution is 16 ps.

Figure 13:
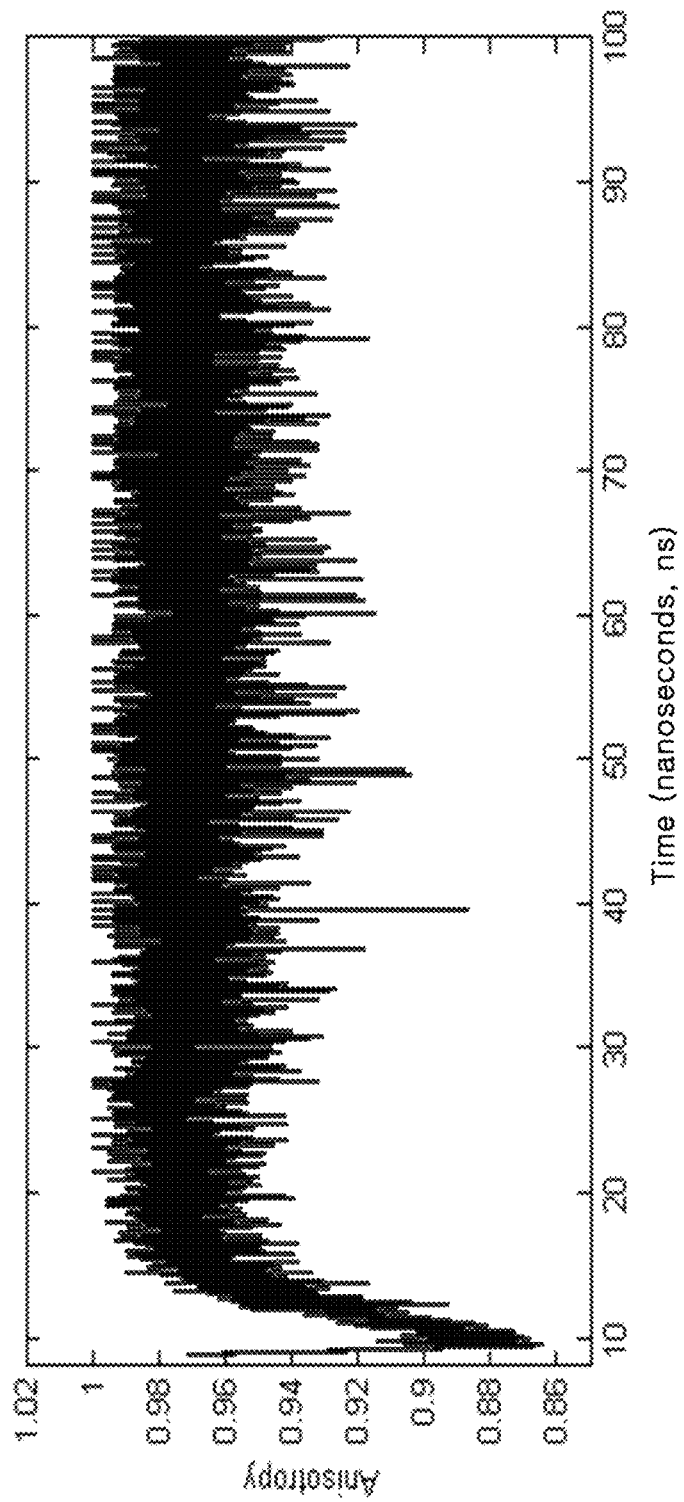
FIG. 13 is a graph of anisotropy versus time (nanoseconds, ns) showing the anisotropic properties of a photoluminescent polarizer as measured in accordance with Example 3-1.

In order to determine the degree of polarization from the fluorescence decay, the time-resolved fluorescence (TRF) measurements are carried out in different configurations as regularly performed to measure the time resolved anisotropy decay. The polarization of collected light is changed by adjusting the polarizer in front of the PMT in the setup of FIG. 12. Excitation and collection are made in parallel and perpendicular modes. Four TRF measurement modes are possible: vertical (vertically polarized) excitation and vertical emission (W), vertical excitation and horizontal (horizontally polarized) emission (VH), horizontal excitation and vertical emission (HV), and horizontal excitation and emission (HH). Polarization of the excitation is used by rotating a laser source 90 degrees. The polarization of the light reaching the PMT may be changed by controlling the polarizer. After the set of measurements are obtained as in FIG. 12, the anisotropy decay curve is fitted. For the photoluminescent polarizer prepared in Example 2, the anisotropy is 0.95, corresponding to a 0.97 polarization degree. This means that the ratio of intensities of transverse electric (TE) and transverse magnetic (TM) emission is 58. The results are shown in FIG. 13. FIG. 13 is a graph of anisotropy versus time (nanoseconds, ns) showing the anisotropic properties of a photoluminescent polarizer.

Example 3-2

A steady-state photoluminescence (PL) of the 1 layer structure prepared in Example 2 is obtained by using a confocal microscope. The results are shown in FIG. 14 and FIG. 15.

Figure 14:
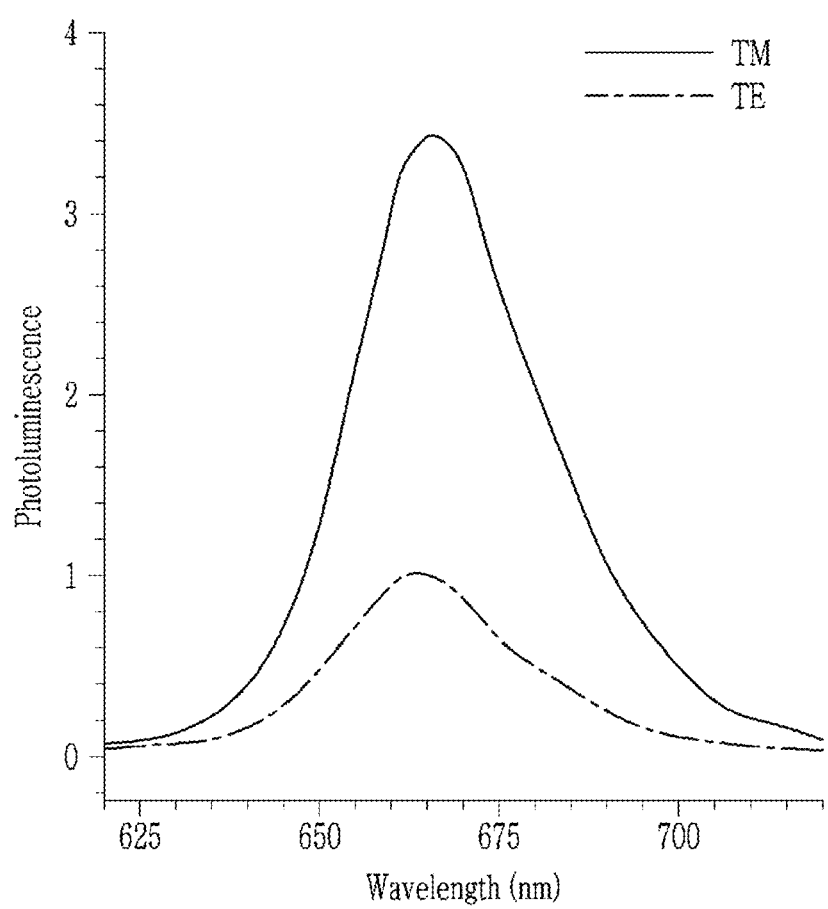
FIG. 14 and FIG. 15 are graphs of photoluminescence versus wavelength (nm), showing the photoluminescent spectrums of a photoluminescent polarizer in accordance with Example 3-2.
Figure 15:
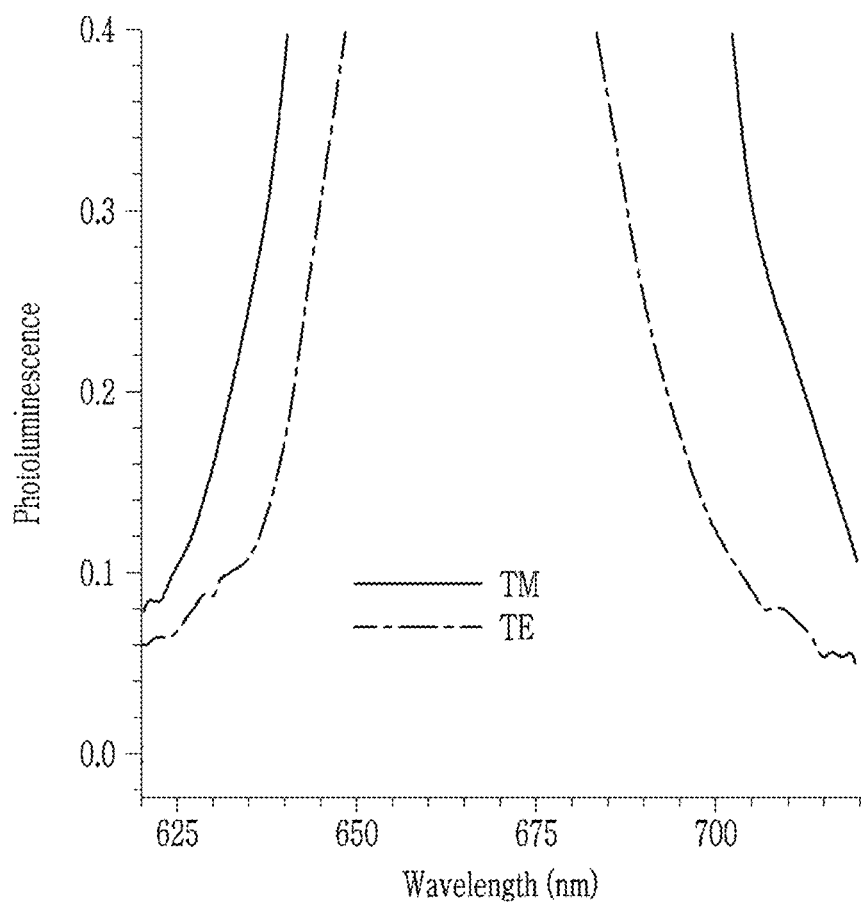

The results of FIG. 14 show that the photoluminescent polarizer of the Example has 3.4 times more emission from TM mode compared to TE mode. The results of FIG. 15 show that in case of the photoluminescent polarizer of the Example, TM mode emission is 11.4 times more than the QDs on flat gold layer. Besides the PL emission level change due to plasmonic interaction PL emission peak wavelength shifts slightly. PL emission peak wavelengths are 663 nm for outside region, 664 for TE mode and 665 nm for TM mode.

Example 3-3

Figure 16:
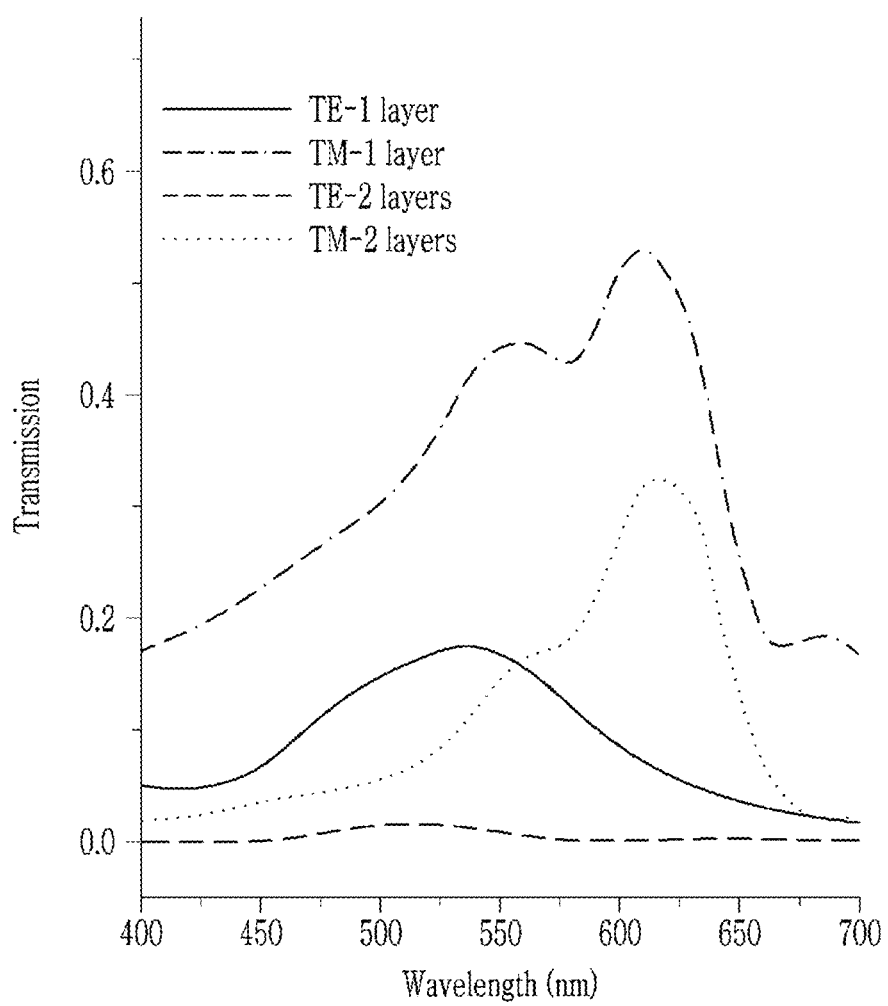
FIG. 16 is a graph of transmission versus wavelength (nm) showing the results for the photoluminescent polarizer in accordance with Example 2.
Figure 17:
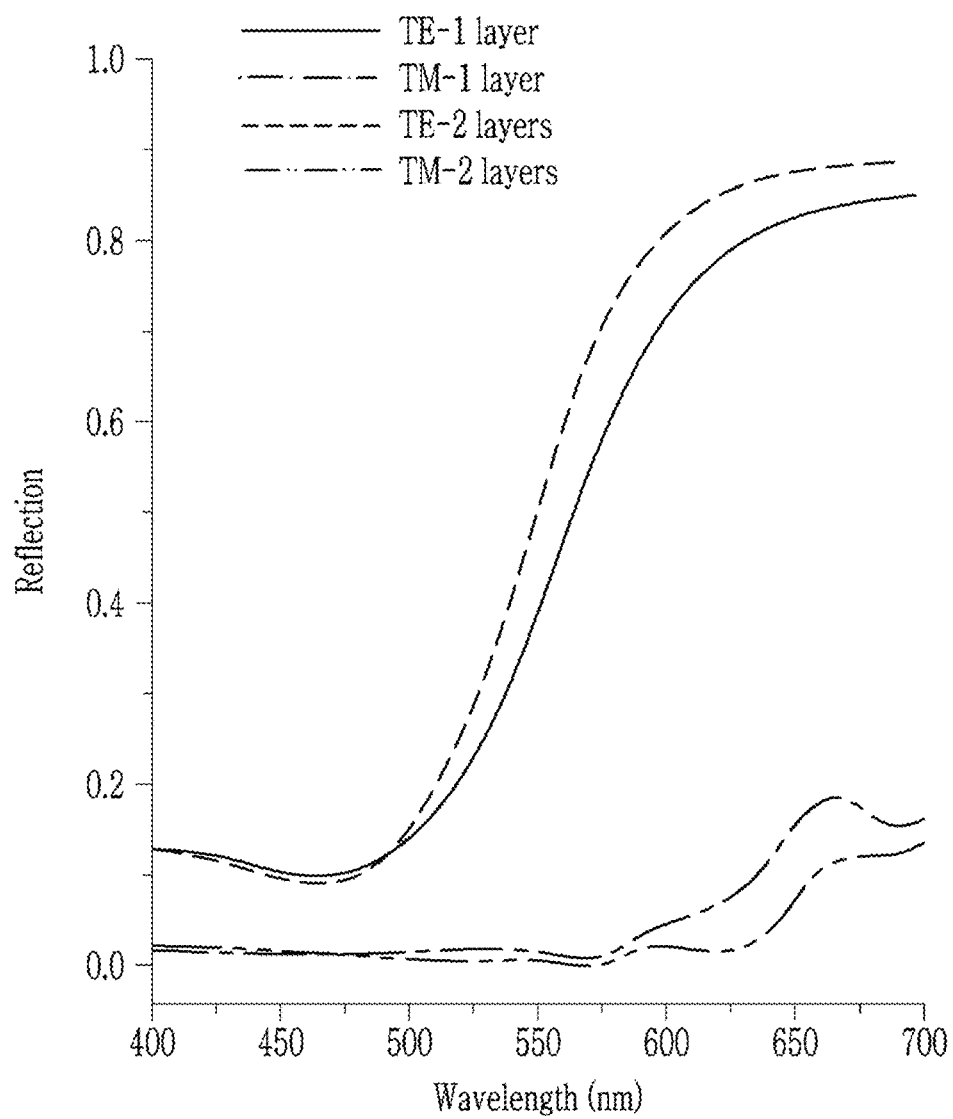
FIGS. 17 and 18 are graphs of reflection versus wavelength (nm) showing the results for the photoluminescent polarizer in accordance with Example 2.
Figure 18:
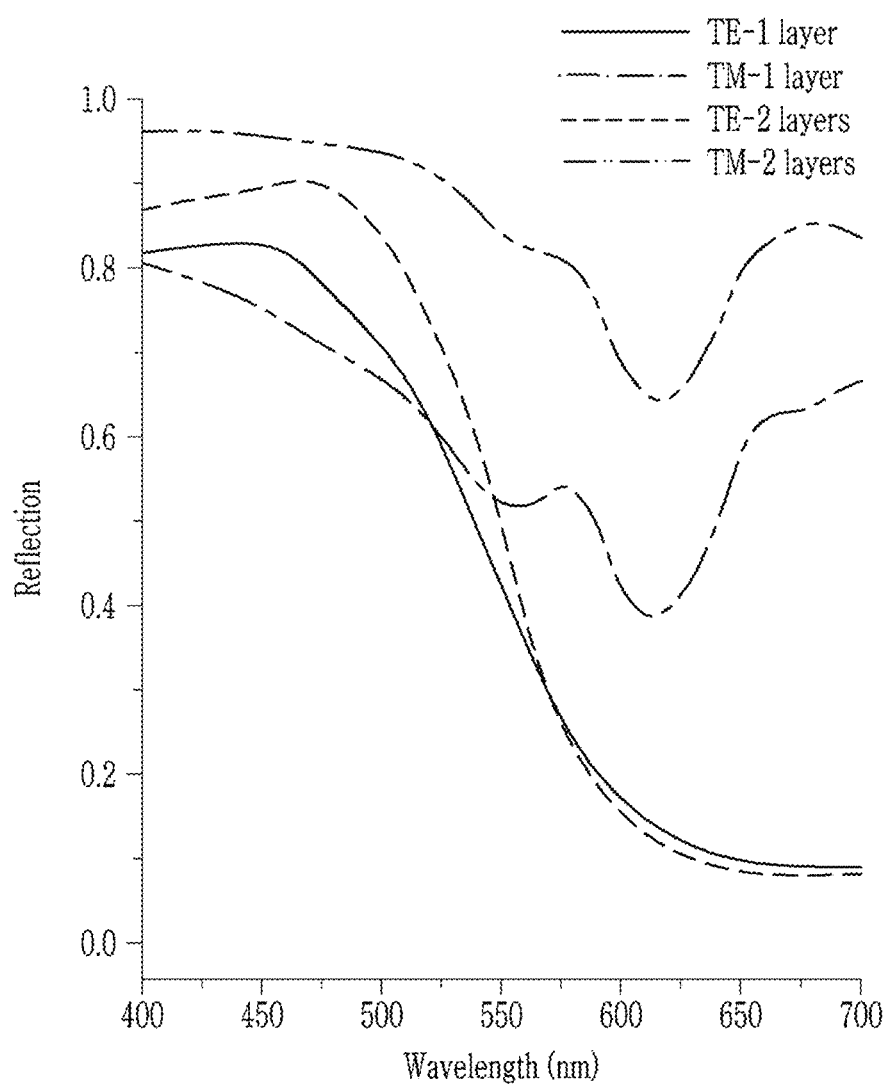
Figure 19:
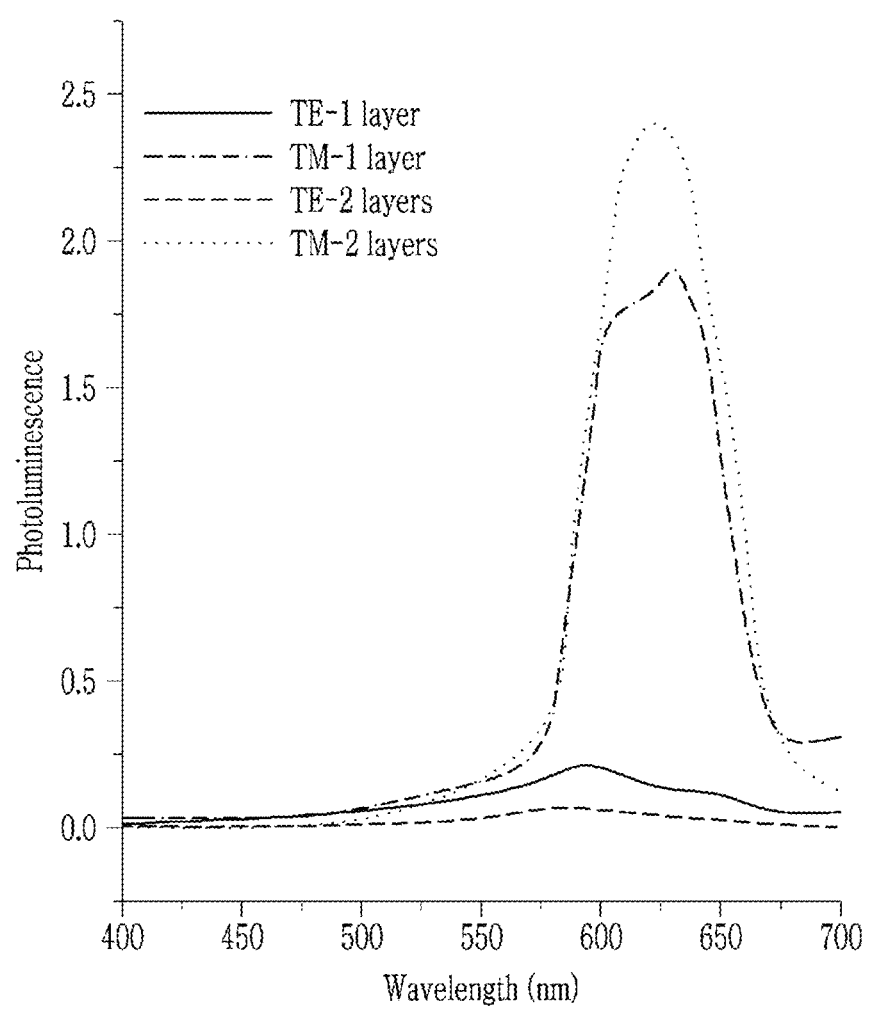
FIG. 19 is a graph of photoluminescence versus wavelength (nm) showing the results for the photoluminescent polarizer in accordance with Example 2
Figure 20:
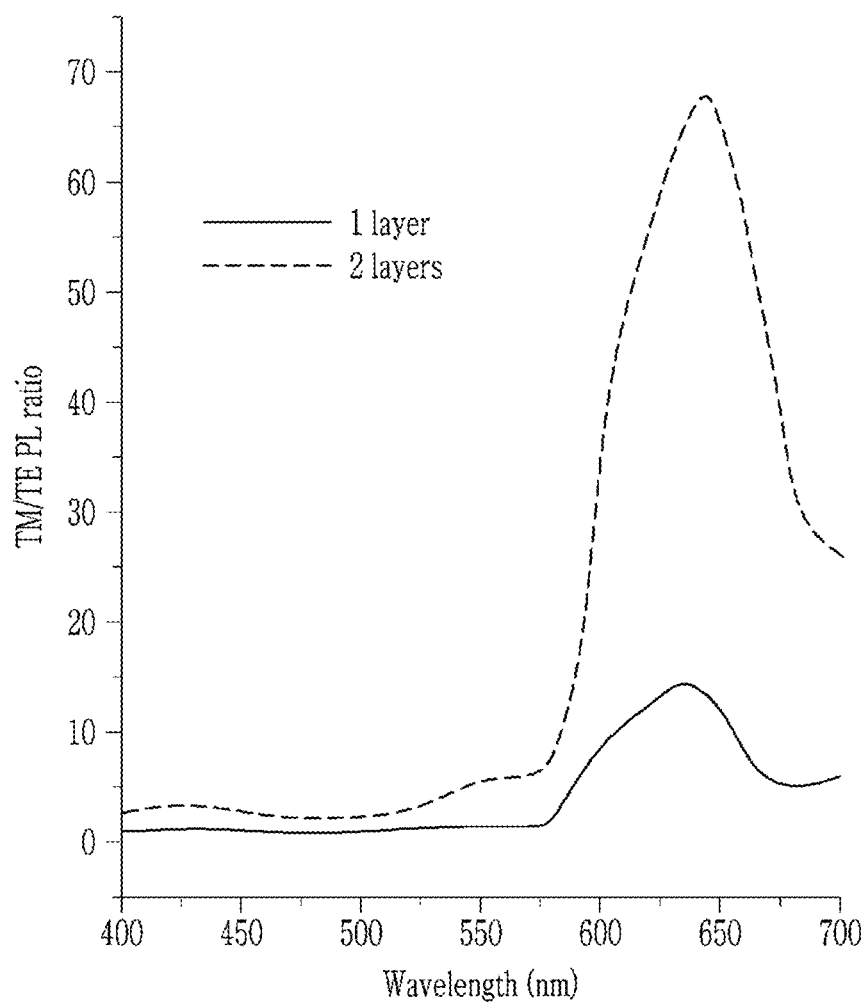
FIG. 20 is a graph of the ratio of transverse magnetic (TM) to transverse electric (TE) intensities (TM/TE) versus wavelength (nm) showing the results of the optical response and photoluminescent (PL) emission simulation of a photoluminescent polarizer in accordance with Example 3-3.

[1] Optical responses and PL emission simulations are made for the photoluminescent polarizer (having 1 unit stack layer and 2 unit stack layers) of Example 2 and the results are summarized in FIGS. 16-20. FIG. 16 is a graph of transmission versus wavelength, FIGS. 17 and 18 are graphs of reflection versus wavelength, FIG. 19 is a graph of photoluminescence versus wavelength, and FIG. 20 is a graph of the ratio of transverse magnetic (TM) to transverse electric (TE) intensities (TM/TE) versus wavelength.

[2] The results indicate that the photoluminescent polarizer is expected to enhance the PL around a 620 nm wavelength which is a very desirable value for red components of the displays.

Example 4: Production of Corrugated PMMA Structure (Replica)

According to the method illustrated in FIG. 7, a PMMA replica having a corrugated surface coated with a gold bilayer is prepared as below. A corrugated mold is obtained in the same manner as set forth in Example 1 and its surface is treated for silanization. A gold (Au) layer is deposited on the silanized and corrugated surface of the mold, a PMMA layer having a thickness of about 6 nm is formed on the deposited gold layer, and then another gold (Au) layer is deposited on the PMMA layer to form a gold bilayer separated by a thin PMMA layer. A thick (in the order of microns) PMMA support layer is formed thereon and the gold bilayer is peeled from the mold to form a PMMA replica having a corrugated surface coated with a gold bilayer.

Figure 21:
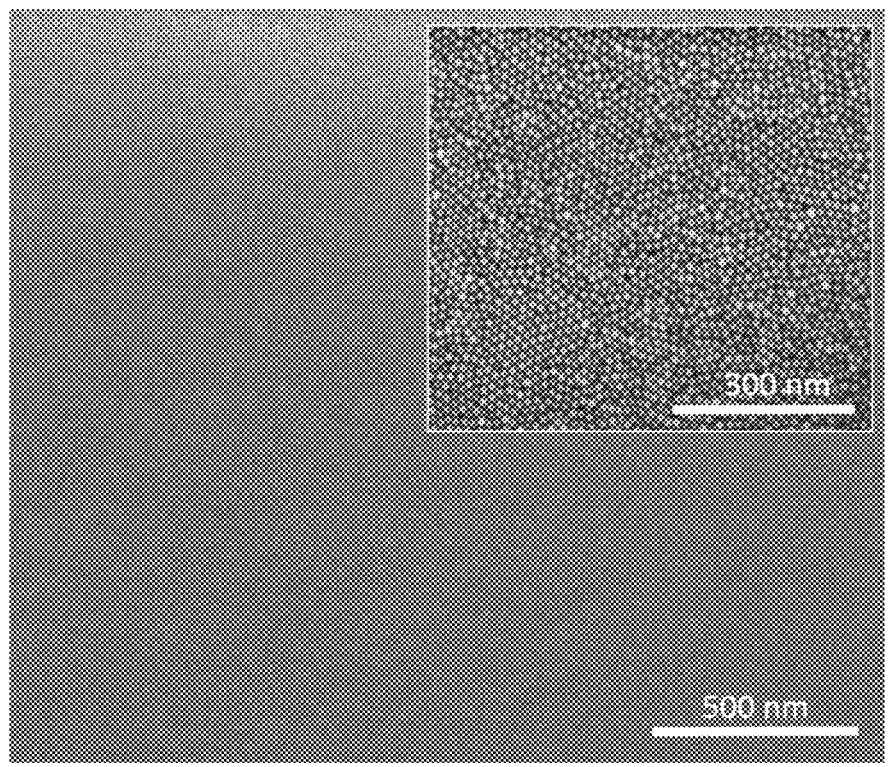
FIG. 21 is a scanning electron microscopic image of a cross-section of a quantum dot monolayer prepared in Example 5.
Figure 22:
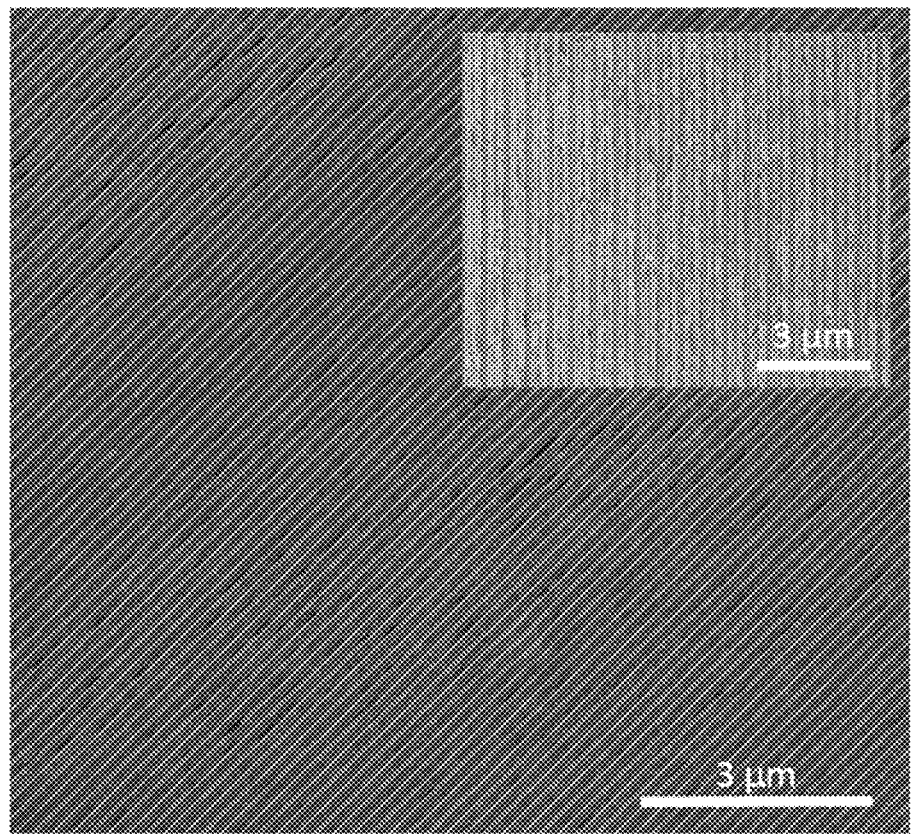
FIG. 22 is a scanning electron microscopic image of a front surface of a photoluminescent polarizer prepared in accordance with Example 5.

Example 5: Production of Photoluminescent Polarizer Using the Corrugated PMMA Replica A PDDA/PSS spacer and a gold layer are formed on the corrugated gold surface of the PMMA prepared in Example 4 in the same manner as set forth in Example 2. Using a self-assembly method, quantum dots are uniformly disposed on the formed gold layer. A toluene solution of the quantum dots obtained in Reference Example 1 is drop on a Teflon well containing ethylene glycol and the toluene is slowly evaporated to form a quantum dot monolayer on the ethylene glycol. A scanning electron microscopic image of the obtained quantum dot monolayer is shown in FIG. 21. The results of FIG. 21 confirm that a uniform monolayer of the quantum dots is formed. The formed monolayer is disposed on the structure having the gold layer and the PDDA/PSS spacer by using a stamping method. A scanning electron microscopic image of the front surface of the obtained photoluminescent polarizer is shown in FIG. 22. The results of FIG. 22 confirm that the polarizer has improved uniformity. It is confirmed that the prepared photoluminescent polarizer may emit linearly polarized light from its front surface.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A photoluminescent polarizer comprising:
a light-transmissive or transparent base having a first surface and a second surface opposite to the first surface, and
a plurality of grid elements disposed on the first surface;
wherein a grid element of the plurality of grid elements comprises a first lateral face, a second lateral face, and at least one photoluminescent unit stack disposed on at least one of the first lateral face and the second lateral face, wherein the first lateral face is angled away from a line perpendicular to the first surface of the base and the second lateral face is angled toward the first lateral face and away from the line perpendicular to the first surface of the base;
wherein the photoluminescent unit stack comprises a light emitting film comprising a light emitting material and a metal film comprising a metal configured for surface plasmon coupling with the light emitting material, the metal film being disposed on at least one surface of the light emitting film; and
wherein the photoluminescent polarizer is configured to linearly polarize at least a portion of incident light passing through the second surface of the base, at least a portion of light emitted from the light emitting material, or both, and to emit polarized light from a front surface of the polarizer,
wherein the light emitting material comprises a semiconductor nanocrystal, a nanosize inorganic phosphor, an organic dye, or a combination thereof.

2. The photoluminescent polarizer of claim 1, wherein the light transmissive or transparent base is flexible.

3. The photoluminescent polarizer of claim 1, wherein the plurality of the grid elements is disposed at a predetermined pitch and has a corrugated pattern.

4. The photoluminescent polarizer of claim 1, wherein the predetermined pitch is less than or equal to about 900 nanometers.

5. The photoluminescent polarizer of claim 1, wherein the plurality of grid elements is integrated with the base.

6. The photoluminescent polarizer of claim 1, wherein an angle between the first lateral face and the line perpendicular to the first surface of the base is greater than or equal to about 1 degree and less than about 90 degrees.

7. The photoluminescent polarizer of claim 1, wherein an angle between the second lateral face and the line perpendicular to the first surface of the base is greater than or equal to about 1 degree and less than about 90 degrees.

8. The photoluminescent polarizer of claim 1, wherein a height of the grid element of the plurality of grid elements is greater than or equal to about 50 nanometers and less than or equal to about 500 nanometers and a width of the grid element is greater than or equal to about 50 nanometers and less than or equal to about 500 nanometers.

9. The photoluminescent polarizer of claim 1, wherein the grid element of the plurality of grid elements has a triangular prism shape, and one of three rectangular lateral faces of the triangular prism is on the first surface of the base and two opposite triangular end faces are disposed perpendicular to the first surface of the base.

10. The photoluminescent polarizer of claim 1, wherein the light emitting film has a thickness of greater than or equal to about 1 nanometer and less than or equal to about 50 nanometer, and the metal film has a thickness of greater than or equal to about 10 nanometers and less than or equal to about 150 nanometers.

11. The photoluminescent polarizer of claim 1, wherein the light emitting material absorbs light having a wavelength between about 300 nanometers to about 650 nanometers and emits light having a wavelength between about 450 nanometers to about 660 nanometers.

12. The photoluminescent polarizer of claim 1, wherein the semiconductor nanocrystal has a particle size of about 2 nanometers to about 12 nanometers, and the semiconductor nanocrystal absorbs light having a wavelength of about 300 nanometers to about 690 nanometers and emits light having a wavelength of about 450 nanometers to about 700 nanometers.

13. The photoluminescent polarizer of claim 1, wherein the semiconductor nanocrystal comprises a Group II-VI compound, a Group III-V compound, a Group IV-VI compound, a Group IV element or compound, a Group compound, a Group II-IV-VI compound, or a combination thereof.

14. The photoluminescent polarizer of claim 1, wherein the semiconductor nanocrystal comprises a quantum dot, a nanorod, a nanoplatelet, or a combination thereof.

15. The photoluminescent polarizer of claim 1, wherein the light emitting film comprises a plurality of layers comprising the light emitting material, and a spacer layer comprising a polyelectrolyte is interposed between at least two adjacent layers among the plurality of layers comprising the light emitting material.

16. The photoluminescent polarizer of claim 1, wherein the metal film covers at least a portion of a surface of the light emitting film.

17. The photoluminescent polarizer of claim 16, wherein a coverage ratio of the metal film with respect to a total area of the surface of the light emitting film is greater than or equal to about 75%.

18. The photoluminescent polarizer of claim 1, wherein the metal film comprises at least one metal layer and the metal layer comprises at least one of a continuous metal layer consisting of the metal, a discontinuous metal layer comprising a plurality of nano-sized particles comprising the metal, or a combination thereof.

19. The photoluminescent polarizer of claim 18, wherein the metal film comprises a plurality of metal layers and a spacer layer interposed between two adjacent metal layers of the plurality of the metal layers, wherein the spacer layer comprises a polyelectrolyte.

20. The photoluminescent polarizer of claim 18, wherein a thickness of the continuous metal layer or the discontinuous metal layer is greater than or equal to about 5 nanometers and less than or equal to about 75 nanometers.

21. The photoluminescent polarizer of claim 1, wherein the metal comprises gold, silver, copper, platinum, aluminum, or a combination thereof.

22. The photoluminescent polarizer of claim 1, wherein at least two photoluminescent unit stacks are disposed on the at least one of the first lateral face and the second lateral face.

23. The photoluminescent polarizer of claim 1, wherein the front surface of the photoluminescent polarizer comprises a corrugated pattern.

24. A photoluminescent polarizer comprising:
a light-transmissive or transparent base having a first surface and a second surface opposite to the first surface, and
a plurality of grid elements disposed on the first surface;
wherein a grid element of the plurality of grid elements comprises a first lateral face, a second lateral face, and at least one photoluminescent unit stack disposed on at least one of the first lateral face and the second lateral face, wherein the first lateral face is angled away from a line perpendicular to the first surface of the base and the second lateral face is angled toward the first lateral face and away from the line perpendicular to the first surface of the base;
wherein the photoluminescent unit stack comprises a light emitting film comprising a light emitting material, a metal film comprising a metal configured for surface plasmon coupling with the light emitting material, the metal film being disposed on at least one surface of the light emitting film, and a spacer separating the light emitting film and the metal film;
wherein the photoluminescent polarizer is configured to linearly polarize at least a portion of incident light passing through the second surface of the base, at least a portion of light emitted from the light emitting material, or both, and to emit polarized light from a front surface of the polarizer; and
wherein the spacer comprises at least one layer comprising a polyelectrolyte that is transparent to light having a wavelength between 300 nanometers and 700 nanometers.

25. The photoluminescent polarizer of claim 24, wherein the polyelectrolyte comprises a cation, an anion, or a combination thereof,
wherein the cation comprises $NR_4^+$ wherein each R is independently hydrogen or a C1 to C3 alkyl, $Na^+$, $K^+$, $Ca^{2+}$, $Mg^{2+}$, or a combination thereof; and the anion comprises a halide, COO—, $SO_4^{2-}$, $SO_3^-$, $HPO_3^-$, or a combination thereof.

26. The photoluminescent polarizer of claim 24, wherein the spacer comprises at least two layers comprising the polyelectrolyte, and two adjacent layers comprising the polyelectrolyte have opposite charges with respect to each other.

27. The photoluminescent polarizer of claim 24, wherein the polyelectrolyte comprises poly(diallyldimethyl sulfonium chloride), polystyrene sulfonate, or a combination thereof.

28. The photoluminescent polarizer of claim 24, wherein a thickness of the spacer is about 1 nanometer to about 50 nanometers.

29. An electronic device comprising
a photoluminescent polarizer; and
a light source,
wherein the photoluminescent polarizer comprises
a light-transmissive or transparent base having a first surface and a second surface opposite to the first surface, and
a plurality of grid elements disposed on the first surface;
wherein a grid element of the plurality of grid elements comprises a first lateral face, a second lateral face, and at least one photoluminescent unit stack disposed on at least one of the first lateral face and the second lateral face, wherein the first lateral face is angled away from a line perpendicular to the first surface of the base and the second lateral face is angled toward the first lateral face and away from the line perpendicular to the first surface of the base;
wherein the photoluminescent unit stack comprises a light emitting film comprising a light emitting material and a metal film comprising a metal configured for surface plasmon coupling with the light emitting material, the metal film being disposed on at least one surface of the light emitting film; and
wherein the photoluminescent polarizer is configured to linearly polarize at least a portion of incident light passing through the second surface of the base, at least a portion of light emitted from the light emitting material, or both, and to emit polarized light from a front surface of the polarizer, and
wherein the light source is configured to provide incident light to the second surface of the light-transmissive or transparent base of the photoluminescent polarizer.

30. The electronic device of claim 29, wherein the electronic device is a light emitting diode, an organic light emitting diode, a sensor, a photovoltaic device, or a liquid crystal display device.

* * * * *